(12) United States Patent
Morikawa

(10) Patent No.: US 6,944,077 B2
(45) Date of Patent: Sep. 13, 2005

(54) READING CIRCUIT AND SEMICONDUCTOR MEMORY DEVICE INCLUDING THE SAME

(75) Inventor: Yoshinao Morikawa, Ikoma (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 0 days.

(21) Appl. No.: 10/636,837

(22) Filed: Aug. 6, 2003

(65) Prior Publication Data

US 2004/0027904 A1 Feb. 12, 2004

(30) Foreign Application Priority Data

Aug. 7, 2002 (JP) ........................................ 2002-229722

(51) Int. Cl.[7] ................................................ G11C 7/00
(52) U.S. Cl. ................................... 365/204; 365/189.07
(58) Field of Search ................................ 365/204, 210, 365/189.07, 189.01

(56) References Cited

U.S. PATENT DOCUMENTS 5,293,088 A * 3/1994 Kasa ........................... 365/204
5,490,110 A * 2/1996 Sawada et al. ............. 365/185.03
5,559,456 A * 9/1996 Hatsuda ....................... 365/203

FOREIGN PATENT DOCUMENTS

JP      2001-311493      7/2000

* cited by examiner

*Primary Examiner*—Thong Q. Le
(74) *Attorney, Agent, or Firm*—Morrison & Foerster LLP

(57) ABSTRACT

A reading circuit for reading information stored in a memory cell includes a current supply circuit for supplying a current to a bit line connected to the memory cell; a comparison circuit for comparing a potential of the bit line supplied with the current by the current supply circuit with a reference potential so as to output the information stored in the memory cell; a disconnection circuit for electrically disconnecting the comparison circuit and the memory cell from each other under a prescribed condition; a charge circuit for charging the bit line, the charge circuit stopping charging of the bit line when the potential of the bit line exceeds a prescribed potential; and a discharge circuit for discharging the bit line when the potential of the bit line exceeds the prescribed potential.

11 Claims, 19 Drawing Sheets

Node 11N potential V

Node 12N potential V

PRC signal voltage V

4e

READING CIRCUIT AND SEMICONDUCTOR MEMORY DEVICE INCLUDING THE SAME

BACKGROUND OF THE INVENTION

1. Field of the Invention

The present invention relates to a reading circuit and a semiconductor memory device including the reading circuit.

2. Description of the Related Art

Conventionally, various types of electrically rewritable nonvolatile memories have been proposed including, for example, EEPROM (Electrically Erasable and Programmable Read Only Memory), flash EEPROM (hereinafter, also referred to as a "flash memory"), MRAM (Magnetic Random Access Memory), and OUM (Ovonic Unified Memory).

These types of nonvolatile memories are common in storing data in a memory cell and reading data from the memory cell, but have different structures.

For example, a flash memory uses, as a memory cell, a MOSFET (Metal Oxide Semiconductor Field Effect Transistor; hereinafter, also referred to as a "transistor") having a floating gate. In the flash memory, charge is accumulated in the floating gate of the memory cell. In accordance with the amount of charges accumulated in the floating gate, the threshold voltage of the gate electrode of the transistor changes. When a voltage equal to or greater than the threshold voltage is applied to the gate electrode of the transistor, a current flows through the transistor. In this specification, the threshold voltage of the gate electrode of the transistor will be referred to as the "threshold voltage of the transistor" or as the "threshold voltage".

In general, the amount of charge accumulated in the floating gate is associated with data, and thus the threshold voltage of the transistor is associated with the data.

For reading data from a flash memory, a memory cell is selected from a plurality of memory cells through a word line and a bit line, and a prescribed voltage is applied to a drain electrode of the selected memory cell through the bit line. Then, the level of current flowing through the memory cell is changed depending on whether the applied voltage is higher or lower than the threshold voltage. Ideally, when the applied voltage is lower than the threshold voltage, no current flows through the memory cell. Therefore, data stored in the memory cell can be read as information by sensing, using a sense amplifier or the like, the change in the level of current flowing through the memory cell in accordance with the threshold voltage, more specifically, the change in the level of current flowing in the bit line connected to the memory cell.

An MRAM has a different structure from that of the flash memory. An MRAM having a combination of a TMR (Tunnel Magnetoresistance) element and a transistor has been proposed, for example.

In the case of an MRAM, data is read from a memory cell in substantially the same manner as in the flash memory. Specifically, a prescribed voltage is applied to a bit line connected to a memory cell, and the change in the level of current flowing through the bit line is sensed by a sense amplifier or the like.

For a circuit for sensing the change in the level of current flowing through a memory cell, it is desired to reduce the degree of change in the level of current flowing through the memory cell and to sense the change in the current level quickly in order to improve the performance of the memory cell.

FIG. 21 is a circuit diagram illustrating a conventional reading circuit 100.

The reading circuit 100 for reading information from a memory cell includes a bit line selecting transistor 102 for selecting a prescribed memory cell from a memory cell array 101 having a plurality of memory cells, a feedback bias circuit 103 connected to the bit line selecting transistor 102, a current supply circuit 115 connected to the feedback bias circuit 103, and a comparator circuit 105. The current supply circuit 115 includes a load circuit 104. The plurality of memory cells in the memory cell array 101 are each connected to a word line WL and a bit line BL.

The comparator circuit 105 has a first input terminal 113, a second input terminal 107, and an output terminal 108. The first input terminal 113 is connected to a connection point (anode 106) for connecting the current supply circuit 115 and the feedback bias circuit 103. The second input terminal 107 is supplied with a reference voltage. The comparator circuit 105 compares the potential of the node 106 connected to the first input terminal 113 with the potential of the reference voltage supplied from the second input terminal 107, and outputs the result of the comparison as information from the output terminal 108.

The reading circuit 100 having the above-described structure operates as follows.

Each of the plurality of memory cells included in the memory cell array 101 is a flash memory cell. A memory cell from which data is to be read is selected from the plurality of memory cells by a word line and a bit line. In the following description, the memory cell from which data is to be read will be referred to as the "reading memory cell".

The potential of the bit line is at the ground level before the reading memory cell is selected from the plurality of memory cells.

First, a word line connected to the reading memory cell is selected, and a bit line connected to the reading memory cell is selected by the bit line selecting transistor 102.

Next, the current supply circuit 115 starts charging the bit line. When the bit line is charged to a certain level, the feedback bias circuit 103 clamps the potential of the bit line. Then, the potential of the node 106 is determined based on how the potential of the bit line is changed after once being clamped in accordance with the level of current flowing through the reading memory cell and the current supply capability of the current supply circuit 115.

Specifically, when the potential of the bit line is raised to a certain level, the potential which is output from an inverter circuit included in the feedback bias circuit 103 connected to the bit line is inverted. Thus, the feedback bias circuit 103 electrically disconnects the reading memory cell and the comparator circuit 105 from each other. In the case where the reading memory cell has a high threshold voltage and thus no current flows through the reading memory cell, the feedback bias circuit 103 keeps the reading memory cell and the comparator circuit 105 disconnected from each other. In the case where the reading memory cell has a low threshold voltage and thus a current flows through the reading memory cell, the output from the inverter of the feedback bias circuit 103 is again inverted, thereby electrically connecting the reading memory cell and the comparator circuit 105. As a result, the potential of the node 106 which is supplied with the current by the current supply circuit 115 is changed in accordance with the threshold voltage of the reading memory cell.

While the current supply capability of the current supply circuit 115 is kept the same, the potential of the first input terminal 113 of the comparator circuit 105 is changed in accordance with the level of current flowing through the reading memory cell. When the reading memory cell is a flash memory cell as in this example, the level of current flowing through the reading memory cell is changed in accordance with the threshold voltage of the transistor of the reading memory cell. Accordingly, the potential of the node 106 is changed in accordance with the threshold voltage of the transistor of the reading memory cell.

The reference voltage of the second input terminal 107 of the comparator circuit 105 (hereinafter, referred to as a "REF voltage") is set to a level at which the change in the potential of the node 106 can be found by the comparator circuit 105.

For example, a voltage intermediate between the potential of the node 106 when the threshold voltage of the transistor of the reading memory cell is high and the potential of the node 106 when the threshold voltage of the transistor of the reading memory cell is low is set as the REF voltage.

With such a setting, the comparator circuit 105 compares the potential of the REF voltage and the potential of the node 106 so as to determine the threshold voltage of the transistor of the reading memory cell and thus read data stored in the reading memory cell.

It is not advantageous to excessively increase the current supply capability of the current supply circuit 115, since when the current supply capability is excessively large as compared to the level of current flowing through the bit line, the potential of the node 106 is not favorable for the reading operation for the following reasons.

As described above, the potential of the node 106 depends on the threshold voltage of the transistor of the reading memory cell. When the bit line selecting transistor 102 becomes conductive and a current flows through the bit line, the potential of the node 106 is changed in accordance with the threshold voltage of the transistor of the reading memory cell. The degree of change in the potential of the node 106 increases as the current supply capability of the current supply circuit 115 increases. The reason is that as the current supply capability of the current supply circuit 115 is higher, the level of current flowing through the bit line is also higher. Accordingly, when the current supply capability of the current supply circuit 115 is excessively high, a long time is required for the potential of the bit line to reach a value appropriate to read data from the reading memory cell, which extends the time for reading data from the reading memory cell. Especially when the capacitance of the bit line is large, the reading time of data is excessively long.

In order to increase the capacity of, and reduce the production cost of, a semiconductor memory device including the reading circuit 100, it has been demanded to reduce the size of the circuits. For this purpose, dielectric layers of the circuits are being made thinner and thinner. In accordance with this, the capacity of bit lines are becoming larger and larger. Therefore, a reading circuit for reading data at high speed from memory cells even with large capacitance bit lines is demanded.

In order to realize such a reading circuit, Japanese Laid-Open Publication No. 2000-311493 proposes a reading circuit having a charge circuit for charging a bit line (hereinafter, referred to as a "precharge circuit").

FIG. 22 is a circuit configuration illustrating a reading circuit 100A disclosed by Japanese Laid-Open Publication No. 2000-311493. In FIG. 22, elements identical to those in FIG. 21 bear identical reference numerals and descriptions thereof will be omitted. The elements having substantially the same functions as those in FIG. 21 bear corresponding reference numerals (for example, a feedback bias circuit 103A instead of the feedback bias circuit 103; and the current supply circuit 115A instead of the current supply circuit 115).

The reading circuit 100A includes a feedback bias circuit 103A, a current supply circuit 115A, a comparator circuit 105 and a precharge circuit 109 for charging a bit line. The current supply circuit 115A includes an n-channel transistor as a load circuit 104a. The precharge circuit 109 has a significantly larger current supply capability than that of the current supply circuit 115A.

An operation of the reading circuit 100A will be described.

First, a bit line connected to a reading memory cell is charged by the precharge circuit 109.

When the bit line is charged to a certain level, the charging by the precharge circuit 109 is stopped, and information is read from a reading memory cell by the comparator circuit 105, the current supply circuit 115A, and the feedback bias circuit 103A in accordance with the change in the level of current flowing through the reading memory cell.

In the reading circuit 100A, the precharge period in which the precharge circuit 109 charges a bit line is determined by an ATDP (address transition detection pulse) signal pulse. An ATDP signal is generated based on a signal by, for example, an address transition detection circuit (not shown).

A clamp potential represented by a clamp voltage, at which the potential of the bit line is clamped, is determined by the feedback bias circuit 103A.

In the reading circuit 100A, a sense amplification enable (SAE) signal becomes an L (low) level during an initial period of the reading operation. When the SAE signal is at the "L" level, the feedback bias circuit 103A stabilizes the potential of the bit line at a prescribed clamp voltage.

During the initial period of the reading operation, the ATDP signal, which corresponds to a bit line precharge signal, becomes the "L" level. In this case, the precharge circuit 109 charges the bit line at high speed.

Hereinafter, an operation of a transistor 110 of the feedback bias circuit 103A will be described.

A driving circuit 111 of the reading circuit 100A is set as follows: when the potential of a node 109N connected to an output terminal of the precharge circuit 109 is changed by a small degree in accordance with the current capability of a reading memory cell 101a while the bit line is charged to the clamp voltage, the output voltage of the driving circuit 111 of the feedback bias circuit 103A (i.e., the potential of a node 111N) is changed.

More specifically, when the potential of the node 111N (i.e., the potential of the gate voltage of the transistor 110) is changed, the ON resistance of the transistor 110 is changed. Thus, the ON resistance of the transistor 110 is changed depending on the potential of the node 109N. When the potential of the node 109N is low, the potential of the node 111N connected to the gate electrode of the transistor 110 is increased, and as a result, the ON resistance is decreased. When the potential of the node 109N is high, the potential of the node 111N connected to the gate electrode of the transistor 110 is decreased, and as a result, the ON resistance is increased.

As described above, the ON resistance of the transistor 110 is changed in accordance with the change in the potential of the node 109N (i.e., the change in the output voltage of the precharge circuit 109). In accordance with the change in the ON resistance of the transistor 110, a potential difference is generated at the first input terminal 113 of the comparator circuit 105.

A charging operation performed by the precharge circuit 109 will be described. In this example, the precharge circuit 109 charges the bit line connected to a reading memory cell 101*a*.

When an ATDP signal is input, the precharge circuit 109 operates to charge the bit line at high speed.

It is assumed here that the precharge circuit 109 is stopped before the potential of the bit line reaches a desired level (i.e., the clamp potential which is determined by the feedback bias circuit 103A) in response to the ATDP signal. Then, the transistor 110, which is on the output side of the feedback bias circuit 103A is kept OFF regardless of the threshold voltage of the reading memory cell 101*a*, and the bit line is continuously charged slowly by the current supply circuit 115A until the bit line is charged to the desired level. Even when the level of current flowing through the reading memory cell 101*a* is changed, the potential of a node 106N does not significantly change.

The reason is as follows. When the potential of the bit line is lower than the potential of the clamp potential determined by the feedback bias circuit 103A, the potential of the node 111N in the feedback bias circuit 103A does not change regardless of the level of current flowing through the reading memory cell 101*a*. The potential of the node 111N which is in the feedback bias circuit 103A and is connected to the output terminal of the driving circuit 111 is set as follows: When the potential of the bit line becomes close to the potential of the clamp potential (i.e., the desired level), the potential of the node 111N is changed based on a small change in the potential of the node 109N which is caused by the level of current flowing through the node 109N connected to the output terminal of the precharge circuit 109.

In general, the clamp potential of the feedback bias circuit 103A is determined in various systems depending on the type of the reading memory cell 101*a*. Often, the clamp voltage represented by the clamp potential is determined to a level which is within a range in which data is not destroyed when being read from the reading memory cell 101*a* and further in which the level of current flowing through the bit line is as high as possible.

Therefore, when the potential of the bit line is lower than the potential of the clamp potential, the level of current flowing through the bit line is not changed as much as expected, and the feedback bias circuit 103A does not operate as expected. As a result, the potential of the first input terminal 113 of the comparator circuit 105 is not expected to undergo a large change.

When the potential of the node 106N does not greatly change for the reason that the level of current flowing through the bit line does not largely change, the comparison operation of the comparator circuit 105 becomes slow. This extends the reading time required for reading data from the reading memory cell 101*a*. For this reason, when the bit line is not sufficiently charged, the reading time is extended.

Next, the case where the precharge circuit 109 keeps on operating even after the potential of the bit line reaches the desired level (i.e., the clamp potential determined by the feedback bias circuit 103A) in response to the ATDP signal (namely, when a transistor 109*a*, which is on the output side of the precharge circuit 109 is kept ON) will be described.

In this case, the bit line is charged to the clamp potential set by the feedback bias circuit 103A. Even if the precharge circuit 109 is operated to charge more, the potential of the node 111N in the feedback bias circuit 103A is decreased and the transistor 109*b* of the precharge circuit 109 is turned OFF. As a result, the precharge circuit 109 stops the charging operation. The transistor 110 is also turned OFF, and thus the bit line is not charged. However, the node 106N is charged by the current supply circuit 115A. Therefore, there is a possibility that the node 106N may be charged up to the charging limit which is determined by the current supply circuit 115A. In this example, the potential of the node 106N may be raised to close to the level of the potential of the power supply VCC less the potential of the threshold voltage of an n-channel transistor 104*a*.

As described above, the gate voltage of the transistor 110 of the feedback bias circuit 103A is changed and there is a voltage difference between the drain voltage and the source voltage of the transistor 110. Therefore, the potential of the node 106N is changed in accordance with the level of current flowing through the reading memory cell 101*a* after the charging of the bit line by the precharge circuit 109 is completed.

Even though there is a large potential difference of the node 106N, once the potential of the node 106N is raised to a certain level, the comparator circuit 105 connected to the node 106N does not operate at high speed unless the potential of the node 106N is decreased to the operating point of the comparator circuit 105. This means that time is wasted during the reading operation from the reading memory cell 101*a*.

In the case where while the potential of the node 106N is increasing by charging, the precharge circuit 109 completes the charging operation in response to the ATDP signal, and further a desired level of current flows through the bit line, the potential of the node 106N stops increasing at the same time as the completion of the charging operation of the bit line. Then, the reading operation from the reading memory cell 101*a* is started.

However, the node 106N has a significantly shorter line than the bit line and thus can be charged in a very short time as compared to the entire bit line. Therefore, when the node 106N is charged in response to the ATDP signal even for a short time after the completion of the charging operation by the precharge circuit 109, the potential of the node 106N is increased.

Actual devices involve variances in the physical conditions of, for example, voltage, temperature and production process. It is practically very difficult to provide the optimum precharge pulse width for the ATDP signal.

In comprehensive consideration of these issues, the entire reading operation may be performed as follows in order to shorten the reading time from the reading memory cell 101*a*.

Specifically, it is preferable to set the pulse width of the precharge period such that the node 106N is charged to raise the potential thereof until the bit line is completely charged rather than leaving the bit line insufficiently charged. In this case, after the charging operation is completed and the potential of the node 106N is decreased to the operating point of the comparator circuit 105, the reading operation is performed.

In this case also, time is wasted until the potential of the node 106N is decreased to the operating point of the comparator circuit 105.

The level of current flowing through the bit line is closely related to the operation of selecting a word line WL.

For example, when the reading memory cell 101*a* is a flash memory cell, unless the potential of the word line reaches the intended level, the gate voltage of the transistor of the reading memory cell 101a is low. As a result, the level of current flowing through the bit line is also low.

In the case where the level of current supplied from the current supply circuit 115A does not rely on the potential of the bit line and thus does not change, and further the level of current flowing through the bit line is low, a long time is necessary for the potential of the bit line to reach the intended level and for a sufficient level of current to flow through the bit line. This also extends the reading time from the reading memory cell 101a.

The selection of the word line WL and the charging of the bit line BL are often performed in parallel in order to shorten the reading time from a reading memory cell. When the selection of the word line is suspended in the middle (specifically, when the potential of the word line does not reach the intended level and the bit line is charged to the desired clamp potential), the level of current flowing through the bit line is lower than that when the potential of the word line reaches the intended level. Therefore, the current supply capability of the current supply circuit 115A is high with respect to the bit line, and the potential of the node 106N is raised in accelerating manner. The potential of the node 106N is increased in a short time.

Hereinafter, the case where the precharge circuit 109 is controlled by the potential of the node 111N which is on the output side of the feedback bias circuit 103A, i.e., which is connected to the gate electrode of the transistor 110, will be described.

The node 111N is originally provided to determine the clamp potential of the selected bit line, and therefore the potential of the node 111N is changed in accordance with even a small change in the potential of the node 109N in the vicinity of the clamp potential.

However, the potential of the node 111N cannot be used for controlling the precharge circuit 109 for the following reason. The potential of the bit line is close to the clamp potential and the bit line is almost completely charged. Therefore, the precharge circuit 109 has almost no current supply capability, and the bit line is not charged to a level higher than the clamp potential which is set by the feedback bias circuit 103A.

As described above, even in the case where the clamp potential of the bit line is set by the feedback bias circuit 103A and is rapidly charged by the precharge circuit 109, it is very difficult to shorten the reading time.

SUMMARY OF THE INVENTION

According to one aspect of the invention, a reading circuit for reading information stored in a memory cell includes a current supply circuit for supplying a current to a bit line connected to the memory cell; a comparison circuit for comparing a potential of the bit line supplied with the current by the current supply circuit with a reference potential so as to output the information stored in the memory cell; a disconnection circuit for electrically disconnecting the comparison circuit and the memory cell from each other under a prescribed condition; a charge circuit for charging the bit line, the charge circuit stopping charging of the bit line when the potential of the bit line exceeds a prescribed potential; and a discharge circuit for discharging the bit line when the potential of the bit line exceeds the prescribed potential.

In one embodiment of the invention, the disconnection circuit includes a feedback bias circuit for electrically disconnecting the comparison circuit and the memory cell from each other when the potential of the bit line exceeds the prescribed potential.

In one embodiment of the invention, the feedback bias circuit controls the potential of the bit line in a feedback manner and restricts the potential of the bit line within a prescribed operating range of the comparison circuit.

In one embodiment of the invention, the disconnecting circuit includes a separation circuit for electrically disconnecting the comparison circuit and the memory cell from each other based on a prescribed signal.

In one embodiment of the invention, the charge circuit controls the potential of the bit line in a feedback manner and restricts the potential of the bit line within a prescribed operating range of the comparison circuit.

In one embodiment of the invention, the reading circuit further includes a reference voltage generation circuit for generating a reference voltage representing the reference potential.

In one embodiment of the invention, the reference voltage generation circuit includes a reference charge circuit for charging a reference bit line connected to a reference cell, the reference charge circuit stopping the charging of the reference bit line when a potential of the reference bit line exceeds a prescribed potential. The charge circuit is short circuited with the reference charge circuit while the charge circuit charges the bit line connected to the memory cell.

In one embodiment of the invention, a current driving capability of the current supply circuit is controlled to compensate for a fluctuation in an electrical characteristic of the memory cell based on an input control signal generated using an active element having the same electric characteristic as that of the memory cell.

According to another aspect of the invention, a semiconductor memory device includes a memory cell array including a plurality of memory cells, each of which is capable of storing information therein; and a reading circuit for reading information stored in one memory cell selected from the plurality of memory cells. The reading circuit includes a current supply circuit for supplying a current to a bit line connected to the one memory cell; a comparison circuit for comparing a potential of the bit line supplied with the current by the current supply circuit with a reference potential so as to output the information stored in the one memory cell; a disconnection circuit for electrically disconnecting the comparison circuit and the one memory cell from each other under a prescribed condition; a charge circuit for charging the bit line, the charge circuit stopping charging of the bit line when the potential of the bit line exceeds a prescribed potential; and a discharge circuit for discharging the bit line when the potential of the bit line exceeds the prescribed potential.

In one embodiment of the invention, the charge circuit starts charging the bit line based on a charging start signal. The charging start signal is generated based on detection of a transition of an address terminal signal.

In one embodiment of the invention, each of the plurality of memory cells is a flash memory cell, a magnetoresistance element, or a read only memory cell.

According to the present invention, the charge circuit charges a bit line, but when the potential of the bit line exceeds a prescribed potential, the charge circuit stops the charging of the bit line and the discharge circuit discharges the bit line. Accordingly, the potential of the bit line can be made a desired level at high speed, and thus the information stored in the memory cell can be read at high speed.

By controlling the charging completion operation of the bit line using the drain electrode node voltage of the feedback bias circuit, the potential difference which is input to the comparison circuit can be generated at high speed in accordance with the level of current flowing through the bit line after the charging operation of the bit line is completed. In addition, after the charging operation of the bit line is completed, a leak path for the bit line is generated using the drain electrode node voltage of the feedback bias circuit during the charging period of the bit line, such that the potential of the node which is input to the comparison circuit immediately becomes within the an operating range of the comparison circuit. Thus, the unnecessary rise in the potential of the node which is input to the comparison circuit while the bit line is charged is prevented.

Thus, the invention described herein makes possible the advantages of providing a reading circuit for reading information from a reading memory cell at high speed and a semiconductor memory device including such a reading circuit.

These and other advantages of the present invention will become apparent to those skilled in the art upon reading and understanding the following detailed description with reference to the accompanying figures.

DESCRIPTION OF THE PREFERRED EMBODIMENTS

Hereinafter, a semiconductor memory device according to the present invention will be described by way of illustrative examples with reference to the accompanying drawings.

Figure 1:
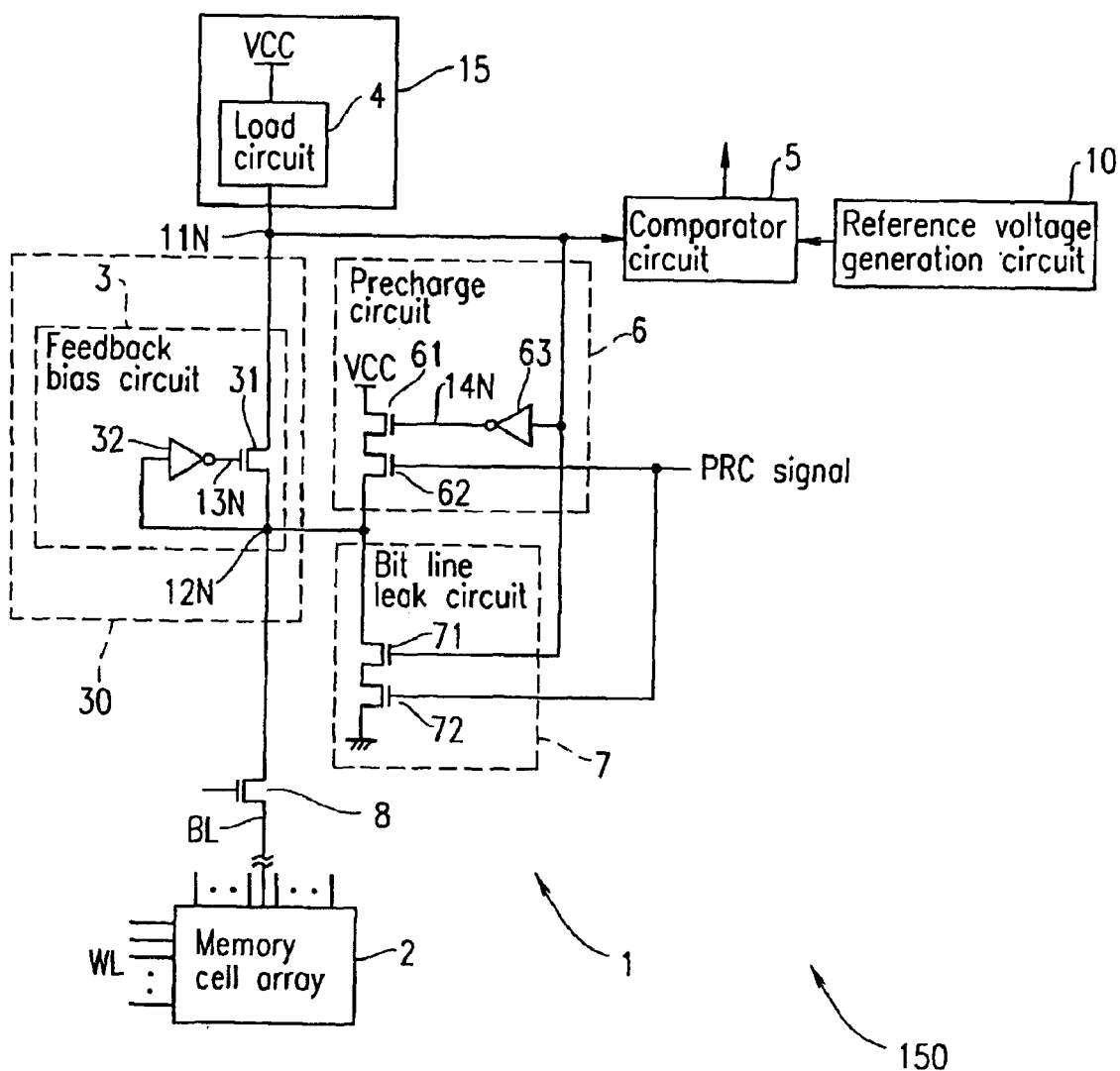
FIG. 1 is a block diagram illustrating a partial structure of a semiconductor memory device 150 according to one example of the present invention.

FIG. 1 is a block diagram illustrating a partial structure of a semiconductor memory device 150 according to one example of the present invention.

The semiconductor memory device 150 includes a memory cell array 2 including a plurality of memory cells, and a reading circuit 1 for reading information stored in a selected memory cell (reading memory cell) among the plurality of memory cells in the memory cell array 2.

The reading circuit 1 includes a current supply circuit 15 for supplying a current to a bit line BL connected to the reading memory cell, a comparator circuit 5 acting as a comparison circuit, a precharge circuit 6 acting as a charge circuit, a disconnection circuit 30 for electrically disconnecting the comparator circuit 5 and the reading memory cell under a prescribed condition, a bit line leak circuit 7 acting as a discharge circuit, and a bit line selecting transistor 8.

The reading circuit 1 may further include a reference voltage generation circuit 10 for generating a reference voltage.

The comparator circuit 5 compares the potential of the bit line supplied with the current by the current supply circuit 15 with a reference potential so as to output information stored in the reading memory cell.

The precharge circuit 6 charges the bit line, and when the potential of the bit line exceeds a prescribed potential, stops the charging of the bit line.

The bit line leak circuit 7 discharges the bit line when the potential of the bit line exceeds a prescribed potential.

The disconnection circuit 30 includes a feedback bias circuit 3. The current supply circuit 15 includes a load circuit 4.

The plurality of memory cells in the memory cell array 2 are flash memory cells and are arranged in a matrix.

Figure 2:
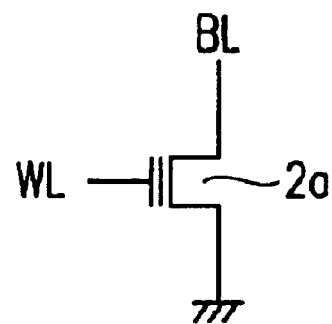
FIG. 2 shows a circuit configuration of an exemplary flash memory cell used in a memory cell array shown in FIG. 1.

FIG. 2 is a circuit diagram illustrating an exemplary flash memory cell 2a (reading memory cell) among the plurality of flash memory cells included in the memory cell array 2.

A word line WL is connected to a gate electrode of the flash memory cell 2a.

As the load circuit 4 shown in FIG. 1, a p-channel transistor 4a is used.

Figure 3:
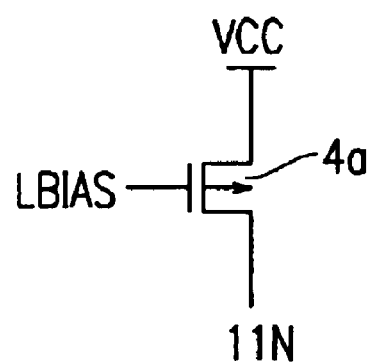
FIG. 3 is a circuit configuration of a current supply circuit shown in FIG. 1.

FIG. 3 is a circuit diagram of the current supply circuit 15 including the p-channel transistor 4a as the load circuit 4. A gate electrode of the p-channel transistor 4a is supplied with an LBIAS signal.

Returning to FIG. 1, the level of current flowing through the bit line BL from the current supply circuit 15 is restricted by the feedback bias circuit 3, so that the potential of the bit line BL is stabilized at a prescribed level. Specifically, the feedback bias circuit 3 acts to clarify the degree of the change in the potential of the bit line in accordance with the level of current flowing through the reading memory cell.

For this purpose, the feedback bias circuit 3 electrically disconnects the comparator 5 and the reading memory cell from each other when the potential of the bit line exceeds a prescribed potential.

The comparator circuit 5 is connected to the bit line BL for carrying data from the reading memory cell. The comparator circuit 5 compares the potential corresponding to the level of current supplied from the current supply circuit 15 to the bit line BL with a prescribed reference potential, and outputs the result of comparison from an output terminal thereof as information stored in the reading memory cell.

The precharge circuit 6 charges the bit line BL by supplying a charging current to the bit line BL in response to an external charging start signal, and stops the charging of the bit line BL when the potential of the bit line BL exceeds a prescribed potential.

The current supply capability of the precharge circuit 6 is set to be significantly higher than that of the current supply circuit 15.

The bit line leak circuit 7 discharges the bit line BL when the potential of the bit line BL exceeds a prescribed potential.

The bit line selecting transistor 8 connects or disconnects a node 11N and the reading memory cell based on a bit line selecting signal which is input to a gate electrode of the bit line selecting transistor 8.

The reading circuit 1 having the above-described structure operates as follows.

The reading memory cell 2a (FIG. 2) is selected by the word line WL and the bit line BL (FIG. 2) in the conventional manner. Also in the conventional manner, the selected bit line BL is charged. Before the bit line BL starts being charged, the potential of the bit line BL is at the ground level.

When to start charging the bit line BL is determined by a precharge period of a PRC (precharge) signal which is input. The PRC signal is, like the ATDP signal, generated based on a signal generated by, for example, an address transition detection circuit (not shown) for detecting a transition of an address terminal signal which specifies the address of the reading memory cell 2a in the memory cell array 2.

Before the bit line BL starts being charged, the potential of the bit line BL is at the ground level. Therefore, the potential of a node 12N is also at the ground level. In this case, the potential of an output node 13N is at the VCC level, and a transistor 31 is ON. Thus, the potential of the node 11N is at the ground level, and therefore the potential of a node 14N is at the VCC level and a transistor 61 is ON. A transistor 62 is OFF.

When the potential of the node 11N is not at the ground level for some reason, the potential of the node 11N may be made the ground level by additionally providing a transistor for initializing the potential of the node 11N to the ground level before the charging operation is started.

When the PRC signal goes into the precharge period, i.e., is turned to the "H" level from the "L" level in order to start charging the bit line BL, the transistor 62 and a transistor 72 are turned ON.

Since the transistor 61 is ON when the bit line BL starts being charged as described above, the charging operation of the bit line BL by the precharge circuit 6 is started.

When the selected bit line BL starts being charged, the potential of the node 12N is increased and the word line WL connected to the reading memory cell 2a also starts being charged.

The selection of the word line WL may be completed before or after the selected bit line BL is completely charged.

First, the case where the selection of the word line WL is completed before the selected bit line BL is completely charged will be discussed.

In this case, the potential of the selected word line WL reaches the intended potential during the second half of the precharge period for the selected bit line BL. A level of current which is required for the reading operation flows through the selected bit line BL.

An inverter 32 is set as follows. When the potential of the selected bit line BL reaches the clamp potential determined by the feedback bias circuit 3, namely, when the charging of the selected bit line BL is completed, the potential of the node 13N is quickly turned from the "H" level to the "L" level in accordance with the change in the potential of the node 12N. When the potential of the node 13N is turned from the "H" level to the "L" level, the transistor 31 is turned from the ON state to the OFF state. Then, the level of current flowing through the transistor 31 is decreased, and thus the potential of the node 11N is increased by being charged by the current supply circuit 15.

When the potential of the node 11N is increased to a certain level, an inverter circuit 63 in the precharge circuit 6 operates. The inverter circuit 63 is set so as to turn the potential of the node 14N from the "H" level to the "L" level. Namely, the level of current supplied from the precharge circuit 6 to the bit line BL is decreased.

When the potential of the node 11N is increased, a transistor 71 is turned ON. Therefore, a leak path is formed for the node 12N by the bit line leak circuit 7, and thus a leak current flows through the leak path.

As described above, the level of current supplied from the precharge circuit 6 to the bit line BL is decreased and the leak current is caused to flow by the bit line leak circuit 7. Also, a current flows through the reading memory cell 2a (FIG. 2), which decreases the potential of the node 12N. As a result, the transistor 31 is turned ON and the potential of the node 11N is decreased.

When the potential of the node 11N is decreased, the precharge circuit 6 operates to charge the bit line BL, and the level of leak current flowing through the bit line leak circuit 7 is decreased.

As a result of these operations, the potential of the node 11N can be kept at a certain level after the bit line BL is completely charged while the PRC signal is at the "H" level.

When the precharge period is over, the PRC signal is turned to the "L" level. Immediately after the charging operation is completed, the potential of the node 11N can be controlled such that the transistor 31 is OFF with the voltage thereof being in the vicinity of the threshold voltage and there is a certain level of voltage difference between the source and the drain of the transistor 31. In the following description, this state will be referred to as "state A".

Next, the case where the selection of the word line WL is completed after the selected bit line BL is completely charged will be discussed.

In this case, the potential of the selected word line WL does not reach the intended potential even after the precharge period for the selected bit line BL is over. A level of current which is required for the reading operation does not flow through the selected bit line BL.

In this case also, the inverter 63 is set in the same manner as above. Namely, the bit line BL is charged until the potential thereof reaches the clamp potential which is determined by the feedback bias circuit 3: and when the potential of the node 11N reaches a prescribed level, the charging operation by the precharge circuit 6 is stopped.

The bit line leak circuit 7 also starts operating. Even when the level of current flowing through the bit line BL is low and the potential of the word line WL has not reached the intended level, the level of leak current caused by the bit line leak circuit 7 is increased as the potential of the node 11N is increased. The increase in the potential of the node 11N is stopped at a certain level.

As a result, the state of the transistor 31 and the potential of the node 11N can be controlled to be in state A.

In this manner, the state of the transistor 31 and the potential of the node 11N can be controlled to be in state A immediately after the precharge period is over, regardless of whether the selection of the word line WL is completed before or after the selected bit line BL is completely charged.

Next, a reading operation performed when state A exists immediately after the precharge period is over will be described.

The level of current flowing through the bit line is changed in accordance with the threshold voltage of the transistor of the reading memory cell 2a (FIG. 2).

First, a reading operation performed when the threshold voltage of the transistor of the reading memory cell 2a is low and the level of current flowing through the reading memory cell is high will be described.

In this case, the potential of the node 12N is decreased in accordance with the capacitance and resistance of the selected bit line BL.

When the potential of the node 12N is decreased, the potential of the node 13N is increased. The voltage difference between the gate electrode and the source electrode of the transistor 31 exceeds the threshold voltage of the transistor 31, and the transistor 31 is turned ON. When a certain level of voltage difference exists between the drain electrode and the source electrode of the transistor 31 and the transistor 31 is ON, the potential of the node 11N immediately starts decreasing. After this, the potential which is determined based on the difference between the level of current supplied from the current supply circuit 15 and the level of current flowing through the reading memory cell 2a (FIG. 2) is decreased. Since the selected bit line BL is provided with a very large capacitance and a very large resistance, the potential of the selected bit line BL is gradually decreased by the influence of the capacitance and resistance.

The potential of the bit line BL is finally stabilized when the level of current supplied from the current supply circuit 15 is balanced with the level of current flowing through the reading memory cell 2a.

Figure 4:
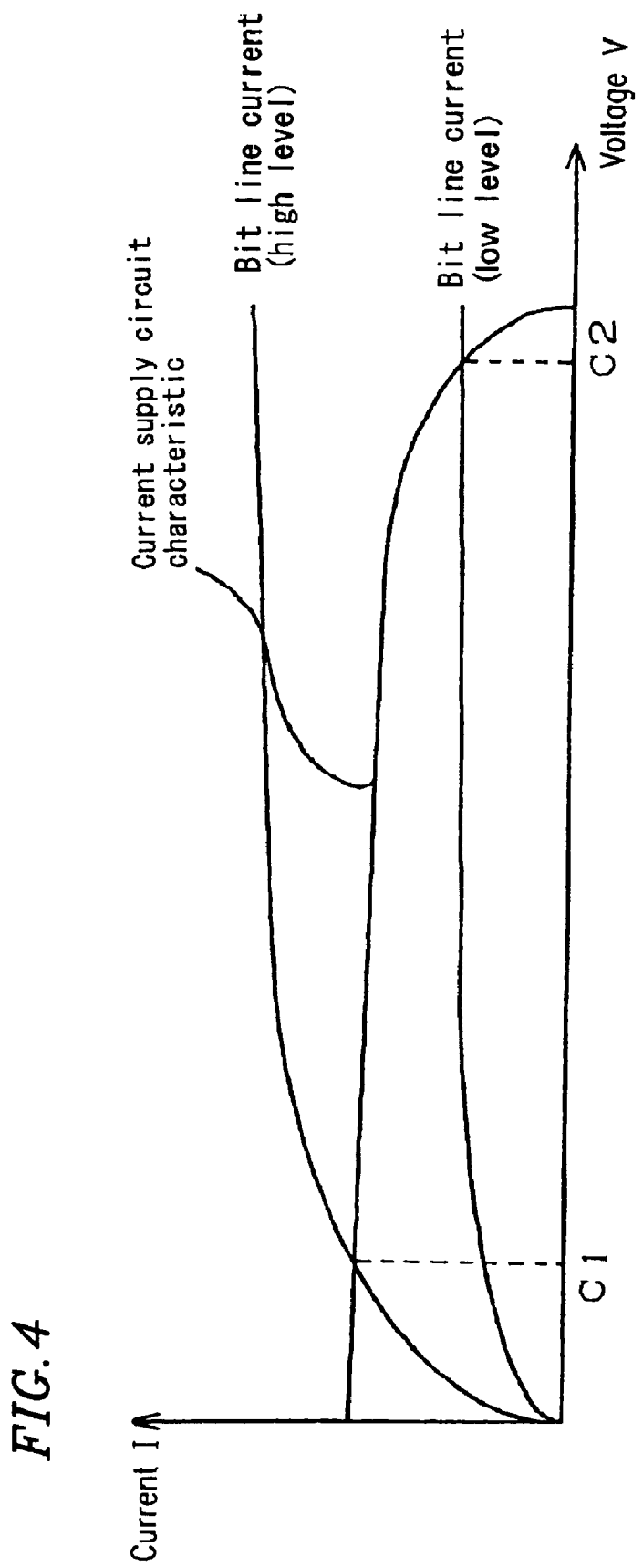
FIG. 4 is a graph of the voltage vs. current characteristic of the current supply circuit shown in FIG. 3 and the current flowing through the bit lines.

FIG. 4 is a graph illustrating the current-voltage characteristics of the current supply circuit 15, the current-voltage characteristics of the bit line BL when the level of current flowing through the bit line BL is high, and the current-voltage characteristics of the bit line BL when the level of current flowing through the bit line BL is low.

In FIG. 4, C1 represents the potential of the bit line BL when the level of current supplied from the current supply circuit 15 is balanced with the level of current flowing through the reading memory cell 2a (FIG. 2).

The potential of the bit line BL is stable at C1. Potential C1 does not rely on the potential at which the bit line BL is charged by the precharge circuit 6. Until the potential of the bit line BL reaches level C1, the potential of the bit line BL is determined by the difference between the level of current flowing through the transistor of the reading memory cell 2a and the level of current supplied from the current supply circuit 15.

Next, a reading operation performed when the threshold voltage of the transistor of the reading memory cell 2a is high and the level of current flowing through the reading memory cell is low will be described.

In this case, the potential of the node 12N is decreased very slowly. The reason is that the level of current flowing through the bit line BL is low and the capacitance and the resistance of the bit line BL are very large.

Since the potential of the node 12N is not substantially changed, the transistor 31 is OFF. The node 11N starts being charged by the current supply circuit 15, regardless of the capacitance or the resistance of the node 12N. Since the capacitance and the resistance of the node 11N are significantly smaller than those of the entire bit line BL, the node 11N is charged at very high speed.

As described above, the operation of the transistor 31 is significantly changed in accordance with the level of current flowing through the bit line BL, i.e., in accordance with the threshold voltage of the transistor of the reading memory cell 2a. When the level of current flowing through the bit line BL is low, the node 11N is charged at very high speed.

Therefore, the degree of change in the potential of the node 11N in accordance with the level of current flowing through the bit line is increased in a short period of time. This allows the comparator circuit 5 to operate at high speed, and thus allows data in the reading memory cell 2a to be read at high speed.

Figure 5A:
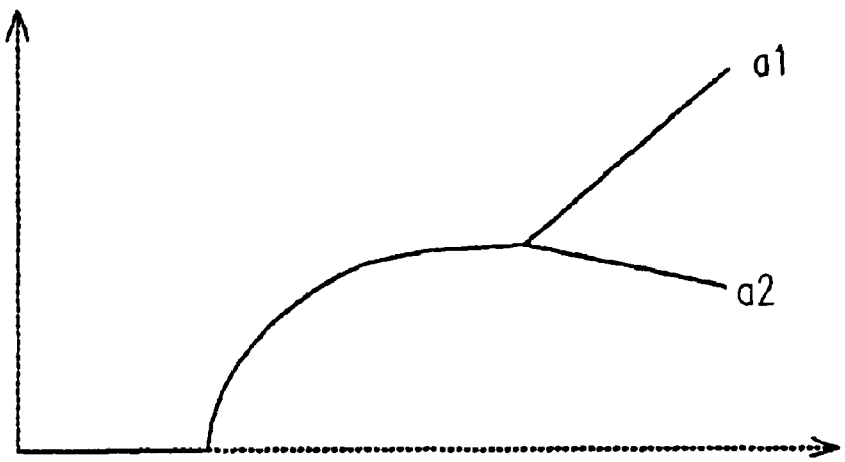
FIG. 5A shows a voltage waveform illustrating the change of the potential of a node 11N shown in FIG. 1 with time.
Figure 5B:
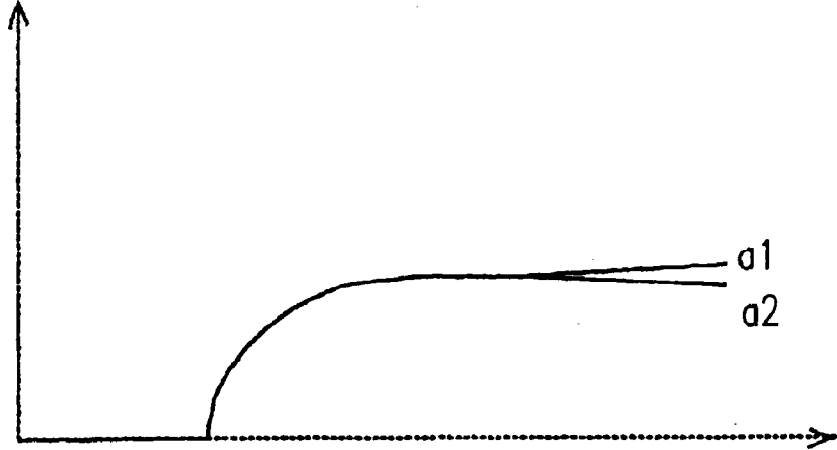
FIG. 5B shows a voltage waveform illustrating the change of the potential of a node 12N shown in FIG. 1 with time.
Figure 5C:
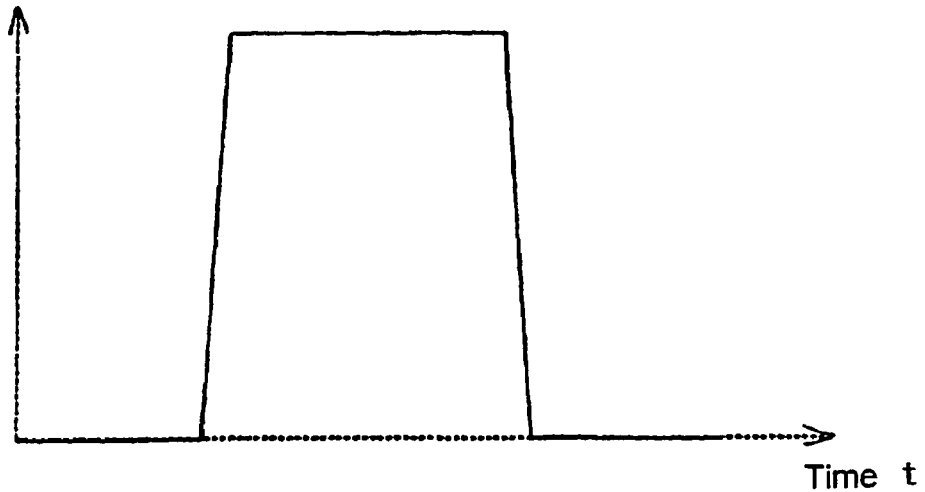
FIG. 5C shows a voltage waveform illustrating the change of a PRC signal voltage with time.

FIG. 5A shows a voltage waveform illustrating the change of the potential of a node 11N (FIG. 1) with time, FIG. 5B shows a voltage waveform illustrating the change of the voltage of the node 12N (FIG. 1) with time, and FIG. 5C shows a voltage waveform illustrating the change of the voltage of the PRC signal with time.

In FIGS. 5A and 5B, curve a1 represents the case where the level of current flowing through the bit line BL is high. Curve a2 represents the case where the level of current flowing through the bit line BL is low.

There is a case where variance in the process conditions or the like causes the level of current flowing through the reading memory cell to be higher than a prescribed level, even though the threshold voltage of the transistor of the reading memory cell 2a is high. In such a case, the level of current flowing through the reading memory cell is increased also when the threshold voltage of the transistor of the reading memory cell 2a is low.

In this case, the level of current necessary to charge the node 11N can be obtained by increasing the current supply capability of the current supply circuit 15 and thus supplying a sufficient level of current to the transistor 31. Since the capacitance and the resistance of the node 11N are small, the potential of the node 11N can be rapidly increased.

Therefore, at the time of completion of the charging operation of the bit line, i.e., when the PRC signal (FIG. 5C) is at the "L" level, the potential of the node 11N is changed rapidly and the inverter circuit 63 for controlling the charging operation of the precharge circuit 6 operates at high speed. Accordingly, whether the precharge circuit 6 is ON or OFF is clearly distinguished. Specifically, the transistor 61 is completely ON when the charging operation is to be ON, and the transistor 61 is completely OFF when the charging operation is to be OFF. Therefore, the potential of the node 14N of the precharge circuit 6 is not changed at an intermediate level, and the operating efficiency of the precharge circuit 6 is high.

A latch circuit may be connected to the output terminal of the comparator circuit 5, so that the data read from the reading memory cell which is output from the comparator circuit 5 after the reading operation is latched. In such a structure, the inverter circuit 32 of the feedback bias circuit 3 does not need to operate after the data is latched. In this case, the inverter 32 may be set to operate only during the reading operation, so that the shoot-through current does not flow after the data is latched.

Figure 6:
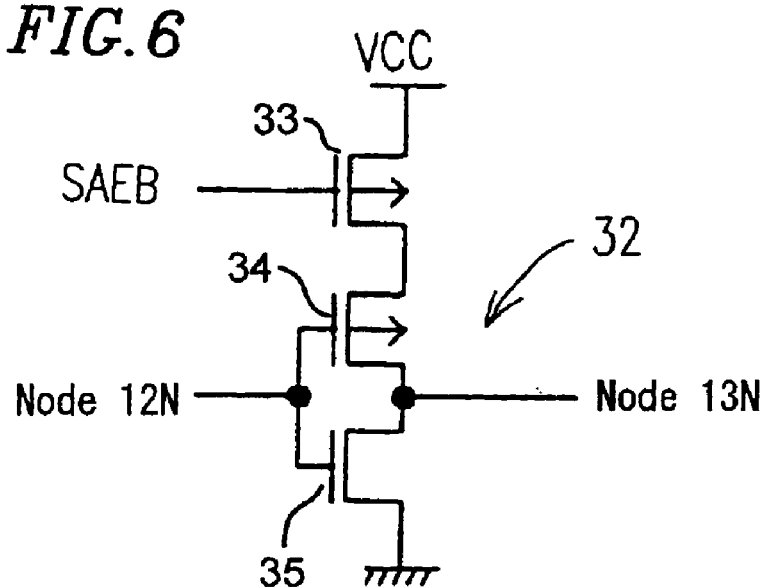
FIG. 6 shows a circuit configuration of an inverter circuit in a feedback bias circuit shown in FIG. 1.

FIG. 6 is a circuit diagram illustrating a specific configuration of the inverter circuit 32 of the feedback bias circuit 3 (FIG. 1).

The inverter circuit 32 includes a p-channel transistor 33, a p-channel transistor 34, and an n-channel transistor 35.

The p-channel transistor 33 includes a gate electrode to be supplied with an SAEB (sense amplification enable bar) signal (an inverse signal of a sense amplification enable signal), a source electrode connected to the power supply VCC, and a drain electrode.

The p-channel transistor 34 includes a gate electrode connected to the node 12N, a source electrode connected to the drain electrode of the p-channel transistor 33, and a drain electrode connected to the node 13N.

The n-channel transistor 35 includes a gate electrode connected to the node 12N, a source electrode which is grounded, and a drain electrode connected to the node 13N.

Therefore, the node 12N is connected to the gate electrode of the p-channel transistor 34 and the gate electrode of the n-channel transistor 35. The node 13N is connected to the drain electrode of the p-channel transistor 34 and the drain electrode of the n-channel transistor 35.

The inverter circuit 32 receives an SAEB signal representing a time period of the reading operation from the reading memory cell 2a. While the SAEB signal is at the "L" level, the latched data is taken in.

The inverter circuit 32 acts an inverter during this period. Except for this period, the p-channel transistor 33 for receiving the SAEB signal is OFF, and thus the inverter circuit 32 can shut off the shoot-through current.

The configuration of the inverter circuit 32 shown in FIG. 6 is merely an example, and the inverter circuit according to the present invention may have any other structure which has substantially the same function.

Regarding the inverter circuit 63 of the precharge circuit 6, it is sufficient to operate only during the precharge period. Therefore, the inverter circuit 63 may have a structure, like that of the inverter circuit 32, of performing only during the precharge period and shutting off the shoot-through circuit except for this period.

Figure 7:
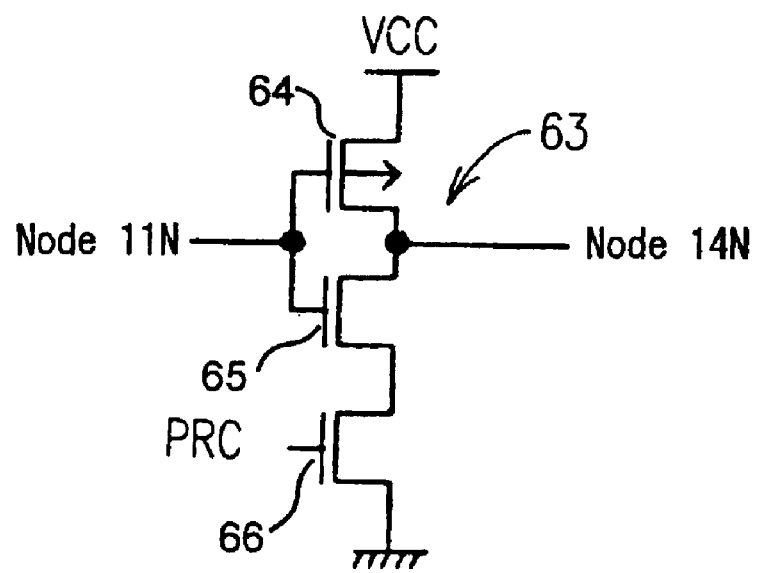
FIG. 7 shows a circuit configuration of an inverter circuit in a precharge circuit shown in FIG. 1.

FIG. 7 is a circuit diagram illustrating a specific configuration of the inverter circuit 63 of the precharge circuit 6 (FIG. 1).

The inverter circuit 63 includes a p-channel transistor 64, an n-channel transistor 65, and an n-channel transistor 66.

The p-channel transistor 64 includes a gate electrode connected to the node 11N, a source electrode connected to the power supply VCC, and a drain electrode connected to the node 14N.

The n-channel transistor 65 includes a gate electrode connected to the node 11N, a source electrode, and a drain electrode connected to the node 14N.

The n-channel transistor 66 includes a gate electrode to be supplied with a PRC signal, a source electrode which is grounded, and a drain electrode connected to the source electrode of the n-channel transistor 65.

Therefore, the node 11N is connected to the gate electrode of the p-channel transistor 64 and the gate electrode of the n-channel transistor 65. The node 14N is connected to the drain electrode of the p-channel transistor 64 and the drain electrode of the n-channel transistor 65.

Again, the configuration of the inverter circuit 63 shown in FIG. 7 is merely an example, and the inverter circuit according to the present invention may have any other structure which has substantially the same function.

Figure 8:
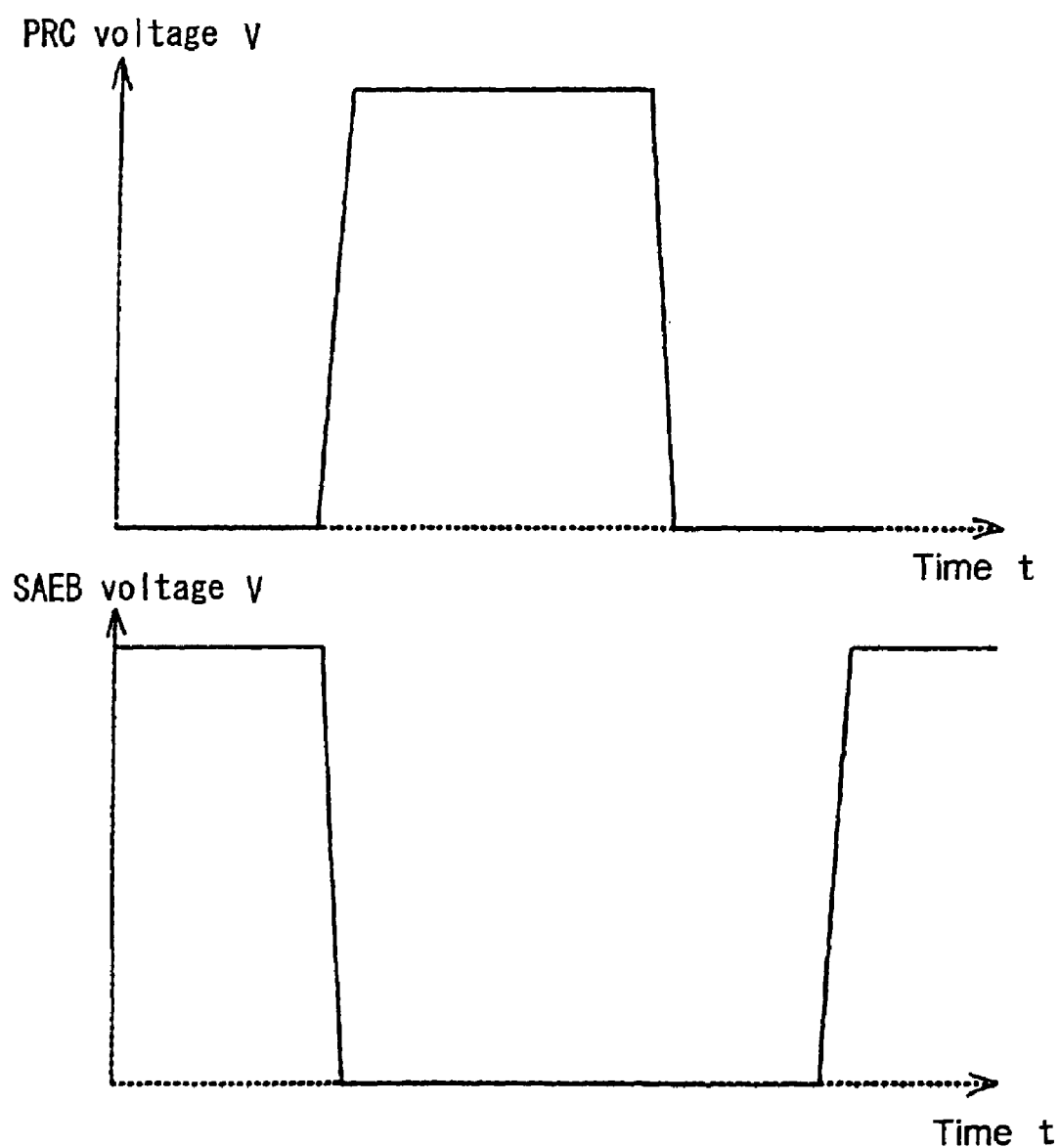
FIG. 8 shows the relationship between the timings of signals which are input to the inverter circuits shown in FIGS. 6 and 7.

FIG. 8 shows graphs illustrating the change of the voltage of the SAEB signal shown in FIG. 6 and the voltage of the PRC signal shown in FIG. 7 with time.

It is sufficient that the SAEB signal is at the "L" level during the reading operation from the reading memory cell 2a and until the data output from the comparator circuit 5 is latched after the charging operation is completed (after the PRC signal drops). It is not necessary that the SAEB signal be at the "L" level when the charging operation of the precharge circuit 6 is started.

Figure 9:
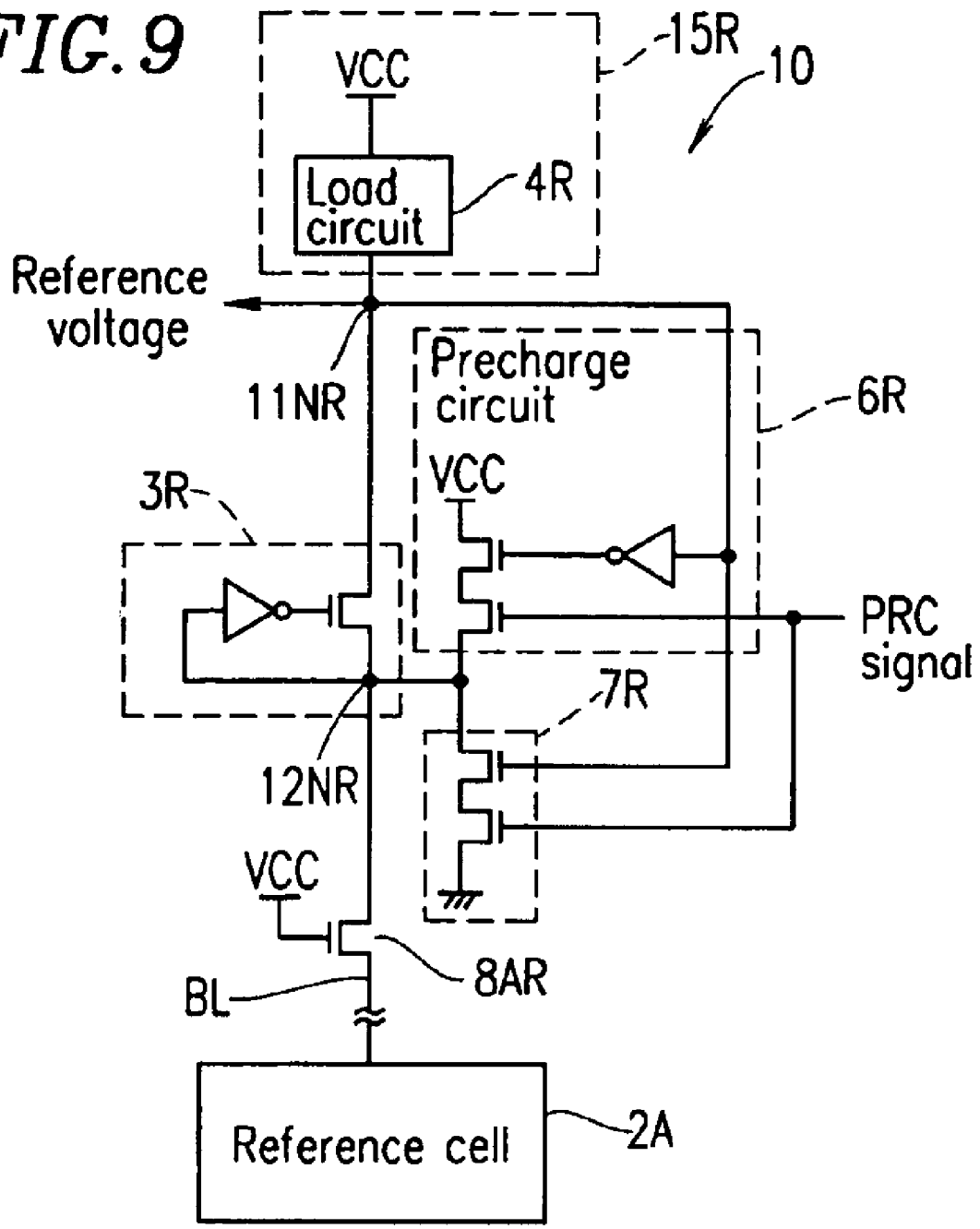
FIG. 9 shows a circuit configuration of a reference voltage generation circuit shown in FIG. 1.

FIG. 9 is a circuit diagram illustrating a specific configuration of a reference voltage generation circuit 10 for supplying a reference voltage to the comparator circuit 5 (FIG. 1).

The reference voltage generation circuit 10 has a structure similar to that of the reading circuit 1. Specifically, the reference voltage generation circuit 10 includes a current supply circuit 15R including a load circuit 4R, a feedback bias circuit 3R, a precharge circuit 6R, a bit line leak circuit 7R, and a bit line selecting transistor 8AR. The current supply circuit 15R, the load circuit 4R, the feedback bias circuit 3R, the precharge circuit 6R, the bit line leak circuit 7R, and the bit line selecting transistor 8AR respectively have the same structure and function as those of the current supply circuit 15, the load circuit 4, the feedback bias circuit 3, the precharge circuit 6, the bit line leak circuit 7, and the bit line selecting transistor 8 (FIG. 1).

By providing the capacitance and the resistance of the bit line BL connected to a reference cell 2A which are the same as those of the reading memory cell 2a (FIG. 2), the change in the potential of a node 12NR in the reference voltage generation circuit 10 during the precharge period is the same as that of the node 12N of the reading circuit 1.

The reference cell 2A is set to cause an appropriate current to flow to the comparator circuit 5 (FIG. 1).

Specifically, while the data is read from the memory cell by the reading circuit 1 after the precharge period is over, the potential of the node 11N depends on the level of current flowing through the reading memory cell. The reference cell 2A is set such that a potential generated by the reference cell 2A is at an intermediate level in the potential fluctuation width of the node 11N.

In the case where the reading memory cell 2a included in the memory cell array 2 and the reference cell 2A are both a flash memory, the current flowing through the reading memory cell 2a can be controlled by changing the threshold voltages thereof. The reference voltage generation circuit 10 is suitable in such a case.

In the case where the reading memory cell 2a is, for example, an MRAM including a TMR (Tunnel Magnetoresistance) element (a magnet resistance element), it may be difficult to form, with one TMR element, a reference cell for generating a current having an intermediate level between the high level and the low level of the current flowing through of the bit line connected to the reading memory cell 2a.

Figure 10:
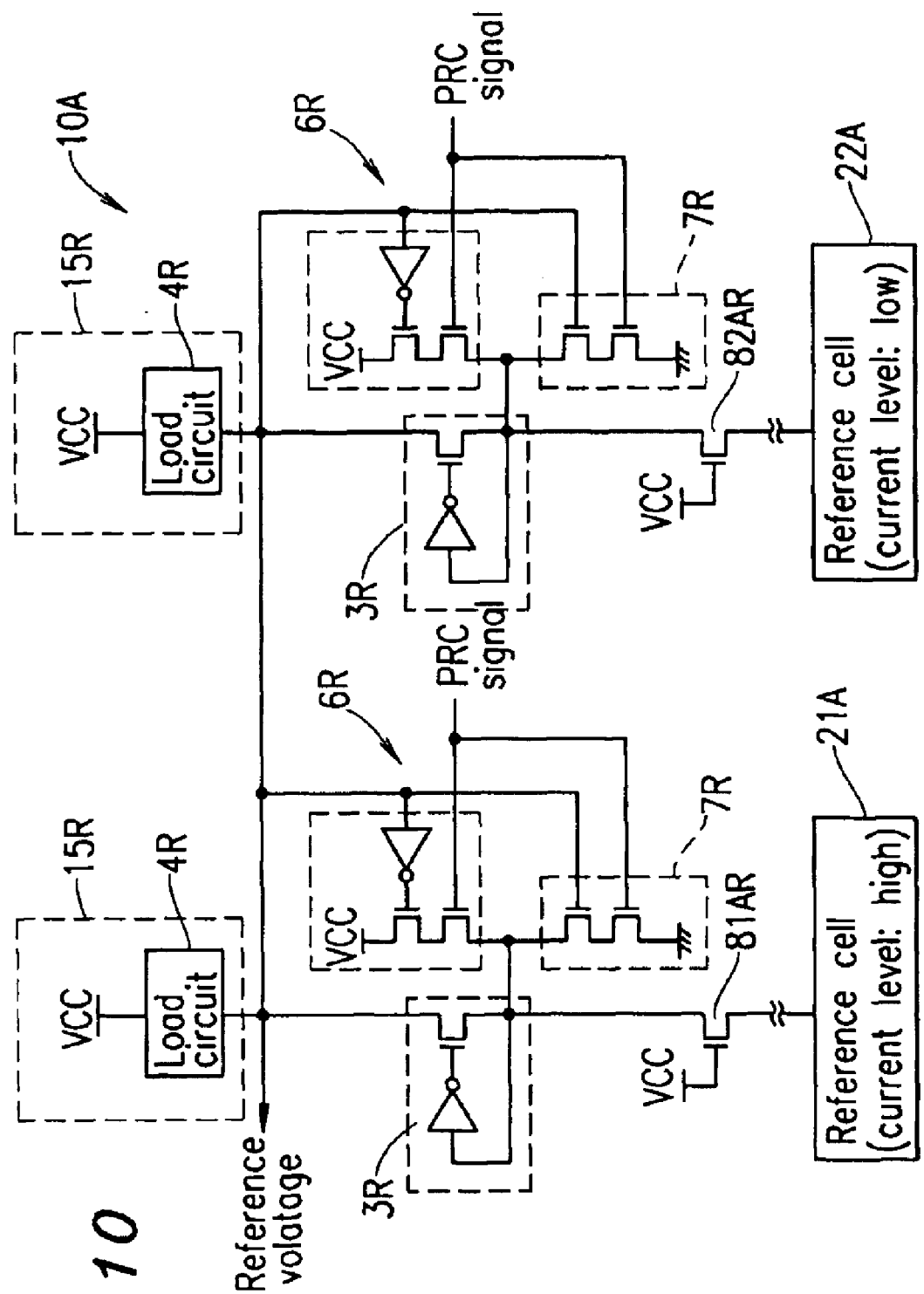
FIG. 10 shows a circuit configuration of another reference voltage generation circuit.

FIG. 10 is a circuit diagram illustrating another exemplary reference voltage generation circuit 10A.

The reference voltage generation circuit 10A includes reference cells 21A and 22A. The reference cell 21A is for generating a current having a high level to flow through the bit line, and the reference cell 22A is for generating a current having a low level to flow through the bit line.

Two bit lines respectively connected to two reference cells 21A and 22A are connected to each other, so that the outputs from the reference cells 21A and 22A are short circuited with each other. Thus, a current having an intermediate level between the potentials of the reference cells 21A and 22A is generated to yield the reference voltage of the reference voltage generation circuit 10A.

By including the reference voltage generation circuit 10A having such a structure, the reading circuit according to the present invention can be suitably applied to memory cells other than flash memory cells.

The reference voltage generation circuit 10A has a current supply capability which is twice as high as that of the reference voltage generation circuit 10 shown in FIG. 9. Therefore, one reference voltage generation circuit 10A can be connected to two comparator circuits 5. Thus, the number of reference voltage generation circuits in a semiconductor memory device can be reduced.

In an actual reading operation performed by the reading circuit 1, the potential of the node 11N and the potential of the reference voltage which are compared by the comparator circuit 5 may not be ideal due to noise or other factors.

Figure 11:
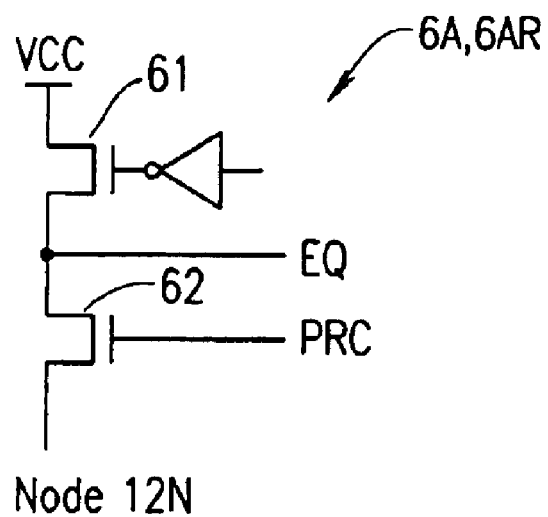
FIG. 11 shows a circuit configuration of a precharge circuit (FIG. 1) and a precharge circuit included in a reference voltage generation circuit (FIG. 9) which are usable for the present invention.

FIG. 11 shows a circuit configuration of a precharge circuit 6A, 6AR which can be included in each of the reading circuit 1 (FIG. 1) and the reference voltage generation circuit 10 (FIG. 9), instead of the precharge circuit 6, 6R (FIG. 9).

The precharge circuit 6A, 6AR has the same configuration as that of the precharge circuit 6, 6R except for the precharge circuit 6A, 6AR includes an EQ (EQualize) node between the transistor 61 and the transistor 62.

By connecting the EQ node of the precharge circuit 6A and the EQ node of the precharge circuit 6AR to each other, the precharge circuits 6A and 6AR are short circuited in a period in which the PRC signal is in an active state representing the start of the precharge period (i.e., a period in which the PRC signal is at the "H" level).

Thus, while the PRC signal is at the "H" level, namely, while the transistor 62 of the precharge circuit 6A, 6AR (FIG. 11) is ON, the bit line BL connected to the reading memory cell 2a and the bit line BL connected to the reference cell 2A are short circuited with each other via the transistor 62. Therefore, after the precharge period is over, a stable intermediate potential is generated in the reference voltage generation circuit 10, and thus the reading operation can be performed at high speed.

Figure 12:
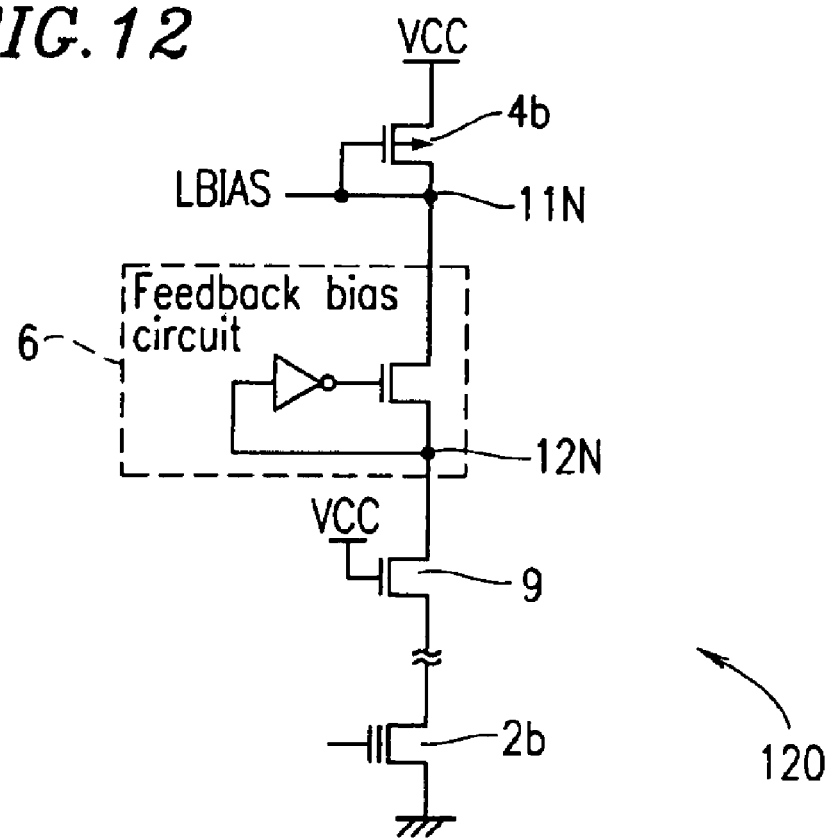
FIG. 12 shows a circuit configuration of an LBIAS voltage generation circuit for generating an LBIAS signal to be applied to a gate electrode of a p-channel transistor of a load circuit shown in FIG. 3.

FIG. 12 is a circuit diagram of an LBIAS voltage generation circuit 120 for generating an LBIAS signal to be applied to a gate electrode of the p-channel transistor 4a of the load circuit 4 (FIG. 3).

The load circuit 4 may or may not include the LBIAS voltage generation circuit 120.

In FIG. 12, a gate electrode of a flash cell transistor 2b is supplied with a voltage which is substantially the same as the voltage of the word line WL connected to the gate electrode of the transistor of the reading memory cell 2a.

The level of an LBIAS voltage signal which is generated by the LBIAS voltage generation circuit 120 is changed in accordance with the gate voltage, the supply voltage, the ambient temperature and other variations in the production process of the flash cell transistor 2b.

Figure 13:
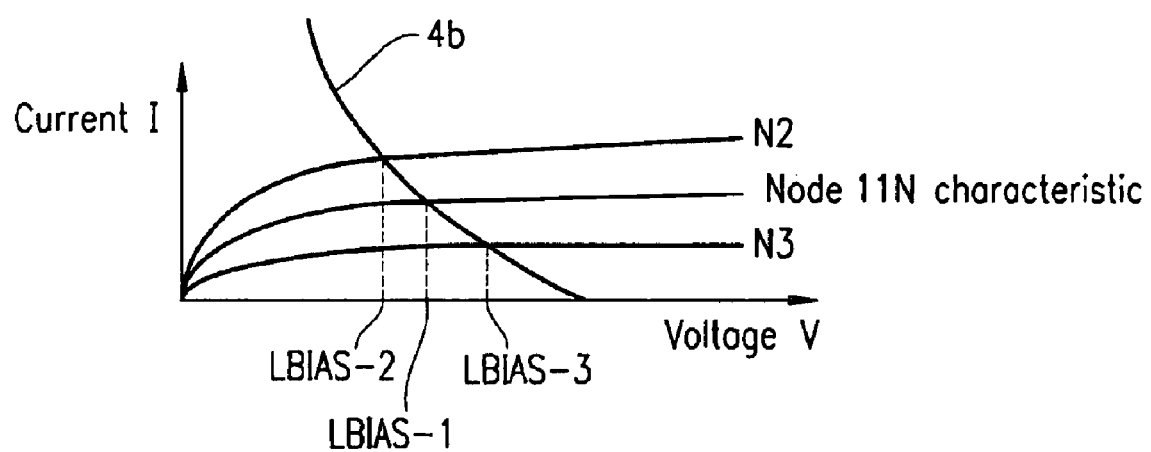
FIG. 13 shows the voltage vs. current characteristics of an LBIAS signal generated by the LBIAS voltage generation circuit.

FIG. 13 is a graph illustrating the voltage vs. current characteristics which show the change in the level of the LBIAS signal generated by the LBIAS voltage generation circuit 120.

FIG. 13 shows the voltage vs. current characteristics of the node 11N and the transistor 4b of the LBIAS voltage generation circuit 120 (FIG. 12).

The LBIAS voltage is determined by the intersection point of the characteristic curve of the node 11N and the characteristic curve of the transistor 4b. In FIG. 13, the LBIAS voltage is represented by "LBIAS-1" voltage.

The current level of the node 11N may be changed due to, for example, the fluctuation in the gate voltage of the flash cell transistor 2b. This changes-the voltage vs. current characteristic of the node 11N.

In FIG. 13, curve N2 represents the voltage vs. current characteristic when the current level is increased, and curve N3 represents the voltage vs. current characteristic when the current level is decreased.

When the current level is increased (N2), the LBIAS voltage is lower than the LBIAS-1 voltage, as represented by "LBIAS-2" voltage in FIG. 13. When the current level is decreased (N3), the LBIAS voltage is higher than the LBIAS-1 voltage, as represented by "LBIAS-3" voltage in FIG. 13.

In other words, the LBIAS voltage (FIG. 12) changes in accordance with the voltage vs. current characteristic of the flash cell transistor 2b.

Figure 14:
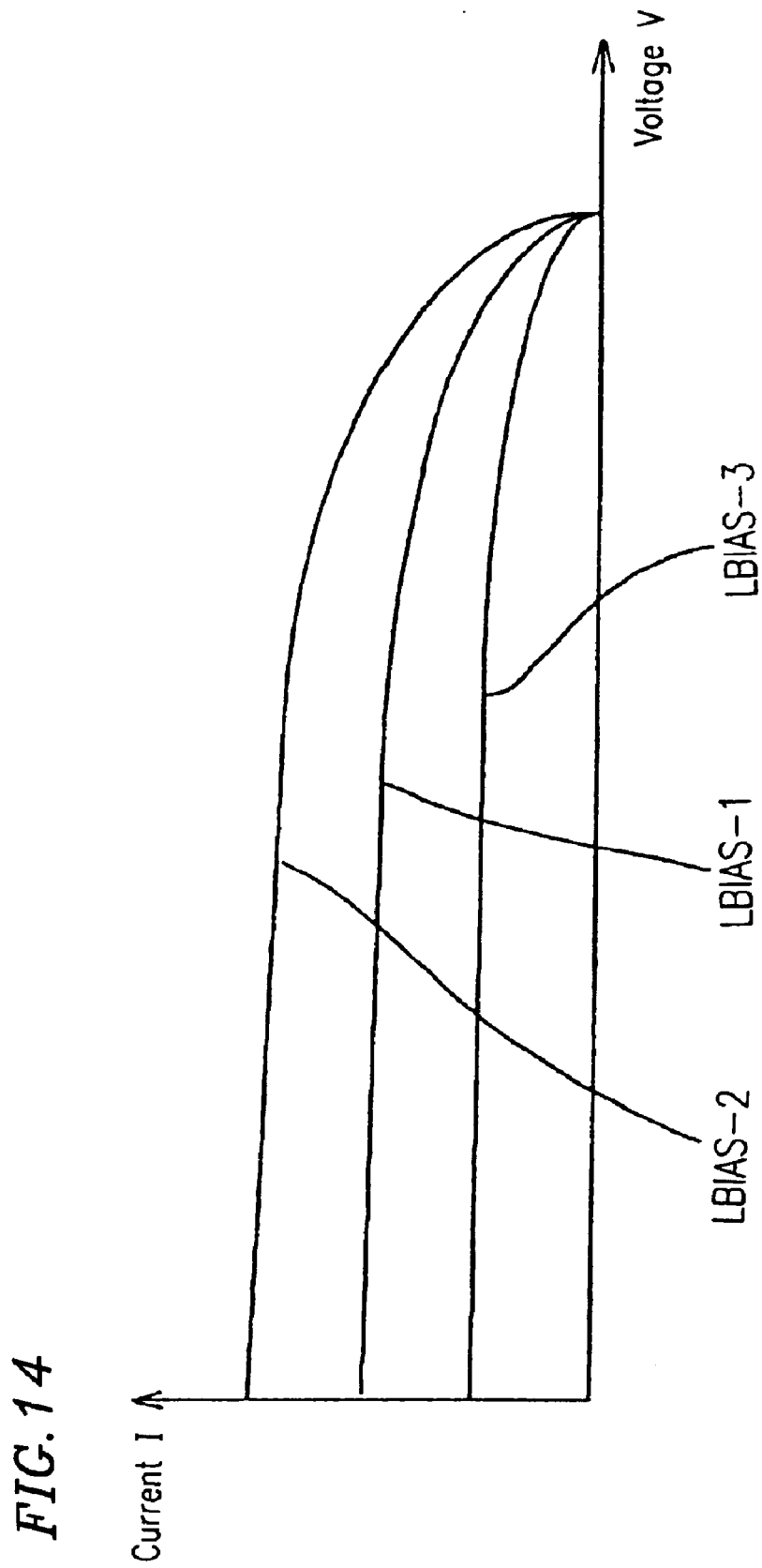
FIG. 14 shows the voltage vs. current characteristics of the current supply circuit shown in FIG. 3.

FIG. 14 is a graph illustrating the voltage vs. current characteristics of the current supply circuit 15 including the load circuit 4 (FIG. 3).

The voltage vs. current characteristic of the current supply circuit 15 changes in accordance with the voltage vs. current characteristic of the transistor of the reading memory cell 2a (FIG. 2). In other words, the voltage vs. current characteristic of the current supply circuit 15 can be set to be suitable for the reading operation in accordance with the voltage vs. current characteristic of the transistor of the reading memory cell 2a.

Specifically, when the level of current flowing through the transistor of the reading memory cell 2a is increased (LBIAS-2), the current supply capability of the current supply circuit 15 including the load circuit 4 is also increased. When the level of current flowing through the transistor of the reading memory cell 2a is decreased (LBIAS-3), the current supply capability of the current supply circuit 15 including the load circuit 4 is also decreased.

Depending on the degree of change in the voltage vs. current characteristic of the transistor of the reading memory cell 2a, the feedback bias circuit 6 may be omitted from the LBIAS voltage generation circuit 120 shown in FIG. 12 with only the transistor 9 being used.

The LBIAS voltage needs to be applied to the load circuit 4 before the precharge period is over. In order to realize this, a plurality of LBIAS voltage generation circuits may be connected in parallel to increase the current supply capability.

Figure 15:
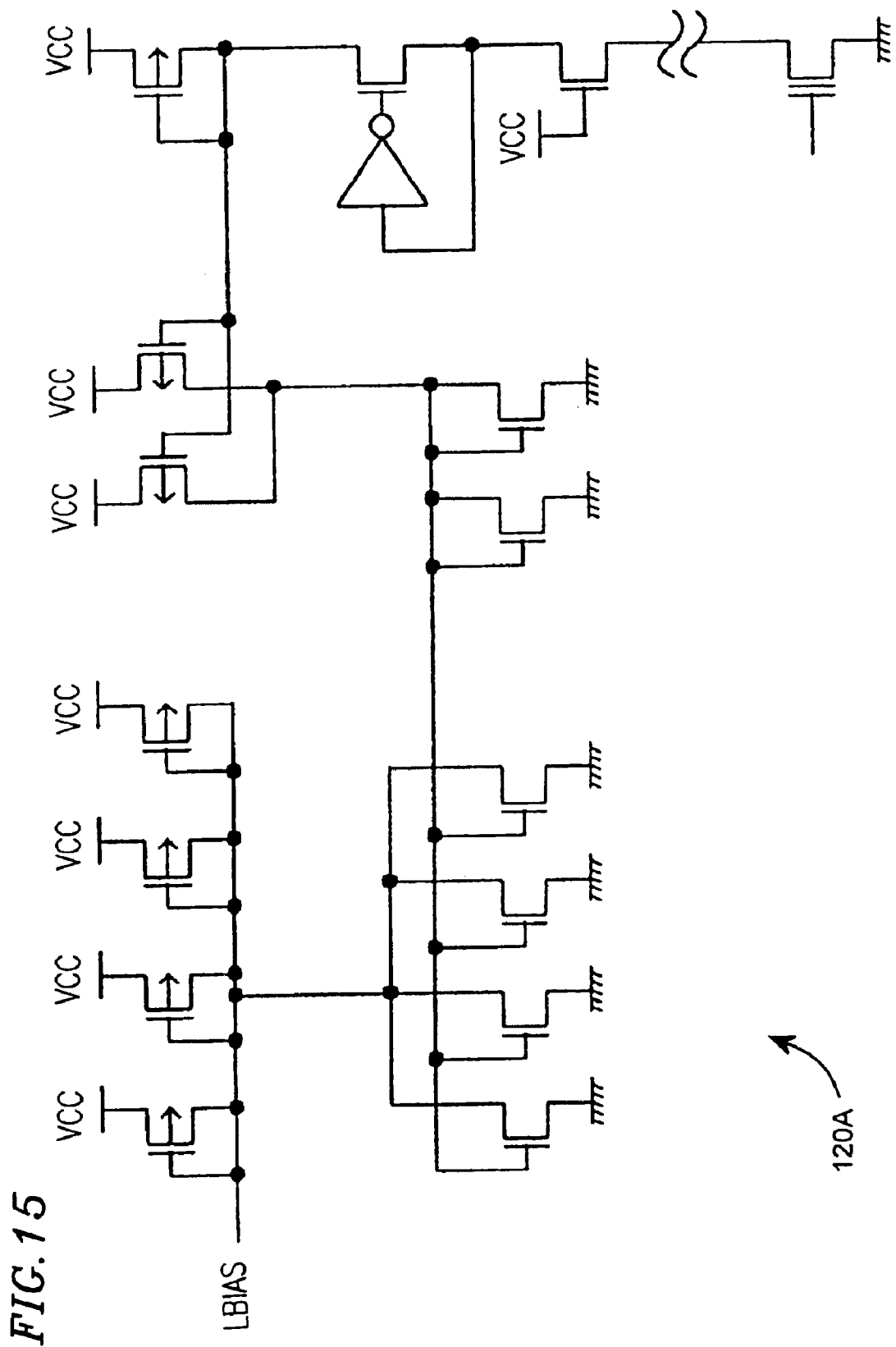
FIG. 15 shows a circuit configuration of another LBIAS voltage generation circuit.

FIG. 15 shows a circuit configuration of another LBIAS voltage generation circuit 120A usable for the present invention. The LBIAS voltage generation circuit 120A includes the LBIAS voltage generation circuit 120 and a current mirror circuit having a high current driving capability connected to the output of the LBIAS voltage generation circuit 120.

Figure 18A:
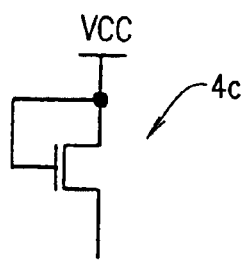
FIG. 18A shows a circuit configuration of a current supply circuit including an n-channel transistor 4c as a load circuit.

FIG. 18A shows a current supply circuit including an n-channel transistor 4c as a load circuit.

Figure 18B:
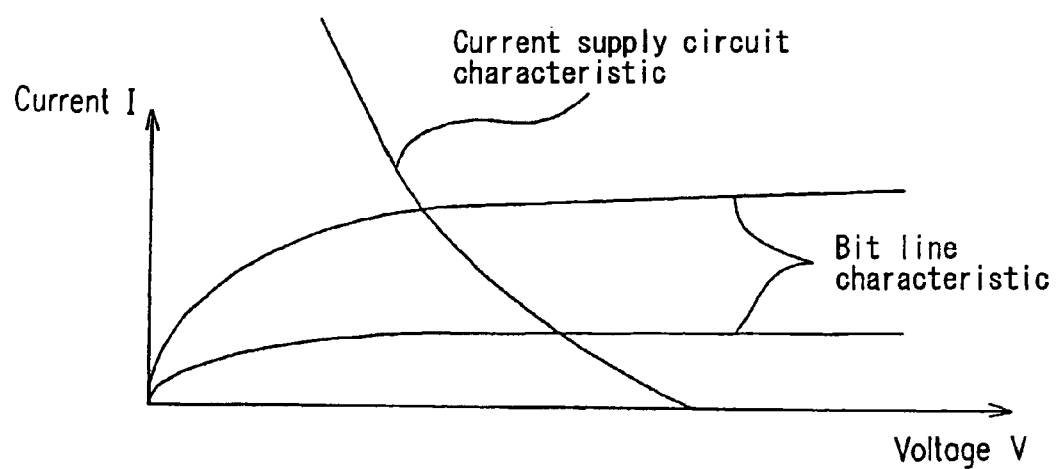
FIG. 18B shows the voltage vs. current characteristic of the current supply circuit shown in FIG. 18A.

FIG. 18B is a graph illustrating the voltage vs. current characteristic of the current supply circuit shown in FIG. 18A.

Figure 19A:
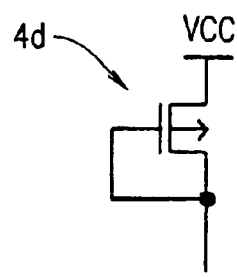
FIG. 19A shows a circuit configuration of a current supply circuit including a p-channel transistor 4d as a load circuit.

FIG. 19A shows a current supply circuit including a p-channel transistor 4d as a load circuit.

Figure 19B:
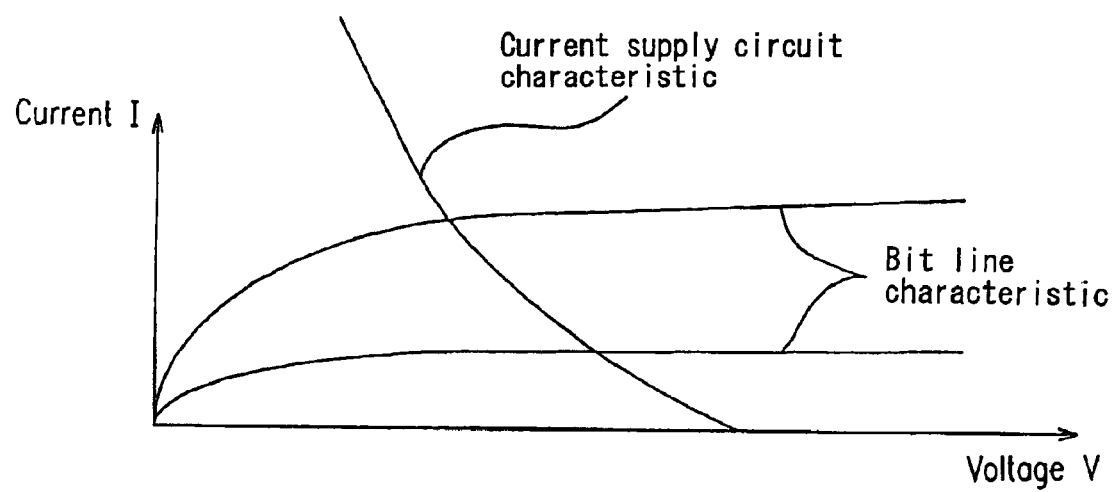
FIG. 19B shows the voltage vs. current characteristic of the current supply circuit shown in FIG. 19A.

FIG. 19B is a graph illustrating the voltage vs. current characteristic of the current supply circuit shown in FIG. 19A.

Figure 20A:
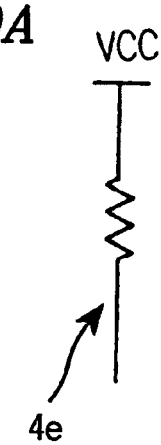
FIG. 20A shows a circuit configuration of a current supply circuit including a resistor 4e as a load circuit.

FIG. 20A shows a current supply circuit including a resistor 4e as a load circuit.

Figure 20B:
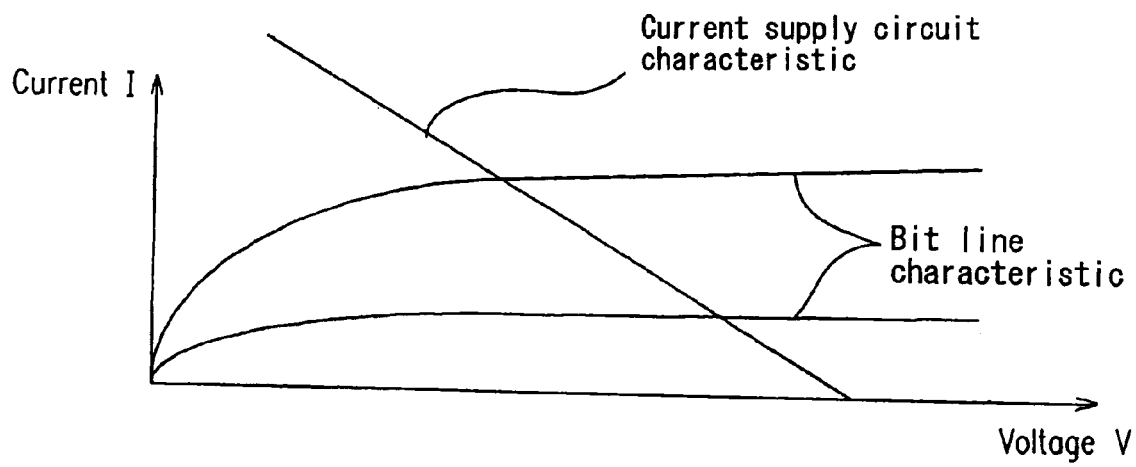
FIG. 20B shows the voltage vs. current characteristic of the current supply circuit shown in FIG. 20A.
Figure 21:
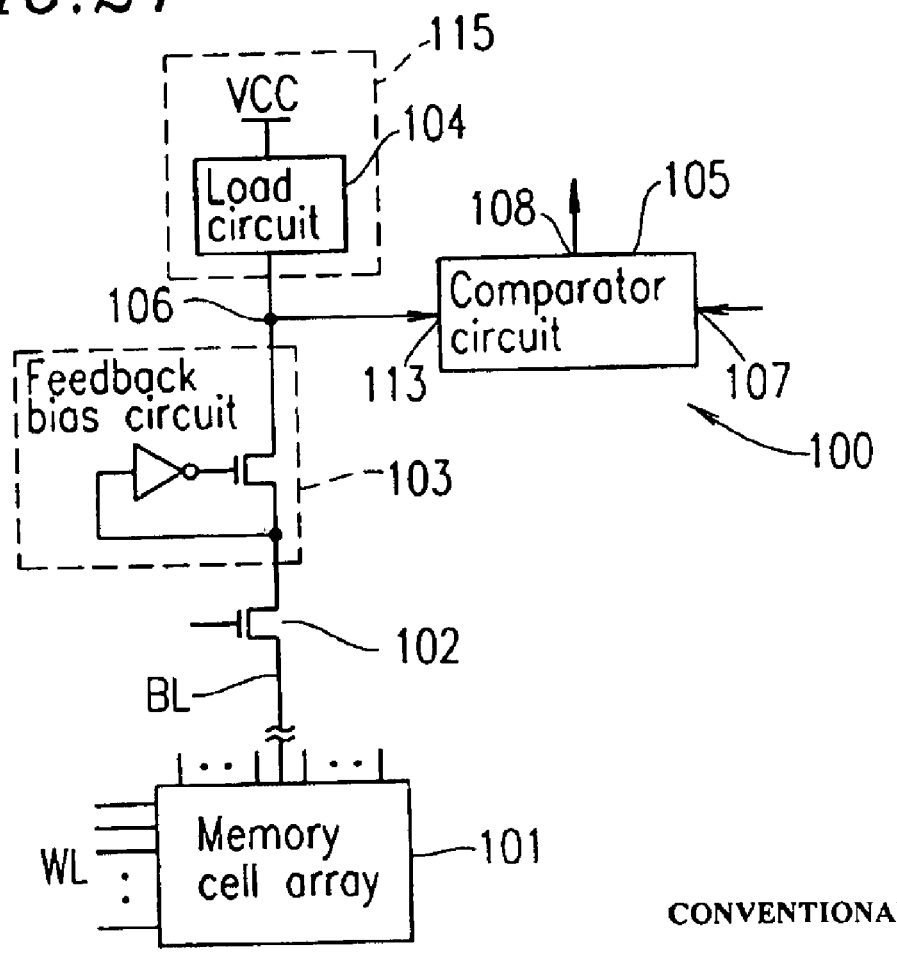
FIG. 21 shows a circuit configuration of a conventional reading circuit for reading information from a memory cell.
Figure 22:
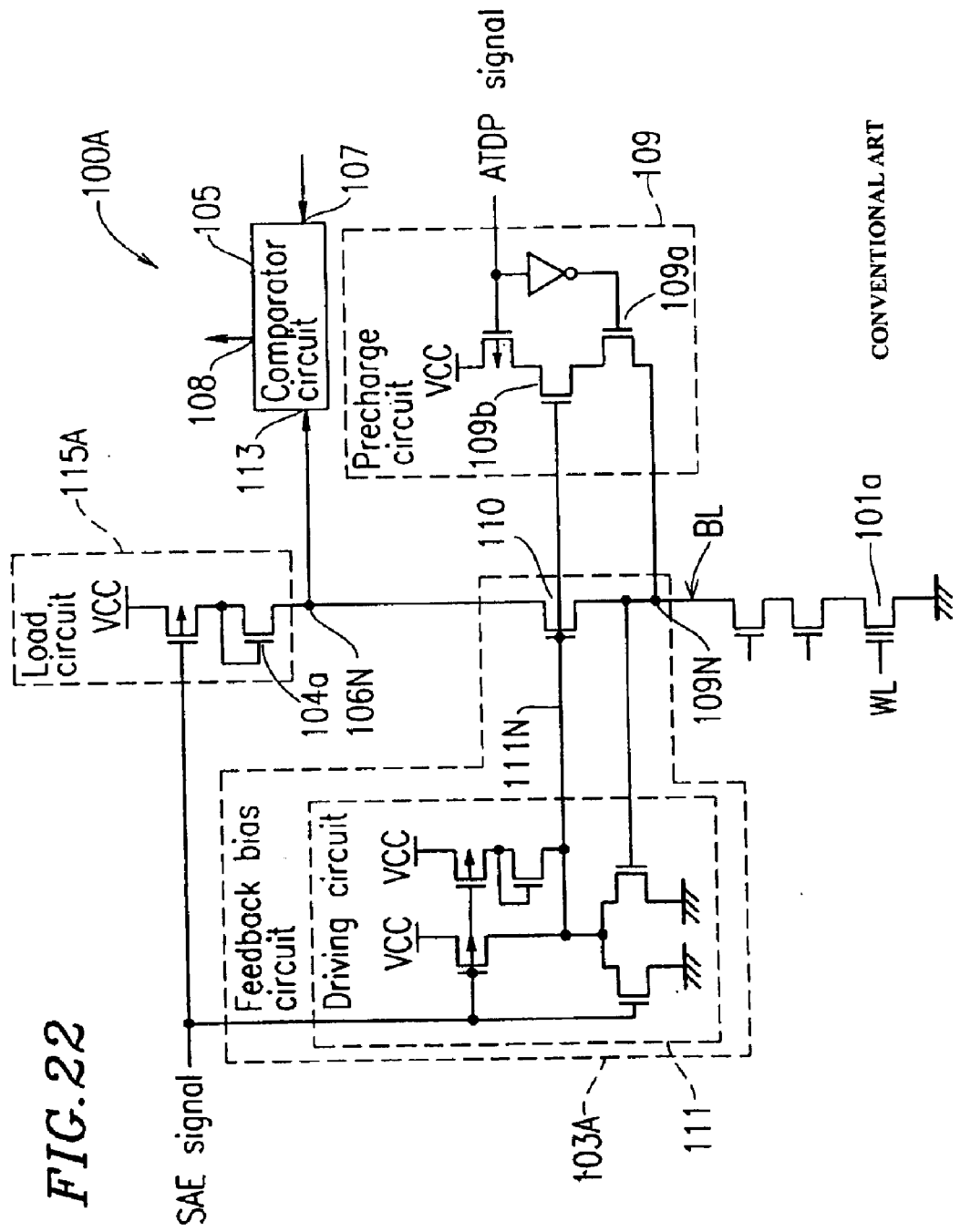
FIG. 22 shows a circuit configuration of another conventional reading circuit for reading information from a memory cell.

FIG. 20B is a graph illustrating the voltage vs. current characteristic of the current supply circuit shown in FIG. 20A.

In FIGS. 18B and 19B (in the case where the n-channel transistor 4c and p-channel transistor 4d are used as the load circuit), the voltage difference between the intersection points of the curve representing the current supply circuit characteristic and the curves representing the bit line characteristic is smaller than the voltage difference in FIG. 4. This indicates that in the case of FIGS. 18B and 19B, the bit line potential is still stabler than in the case of FIG. 4 even when there is a variance in the voltage vs. current characteristic of the current supply circuit.

In FIG. 20B (in the case where the resistor 4e is used as the load circuit), the potential of the bit line is stable regardless of the variance in the characteristic of the transistor. By adjusting the resistance value, the voltage difference can be larger than in the case where the n-channel transistor 4c or the p-channel transistor 4d is used as the load circuit.

Figure 23:
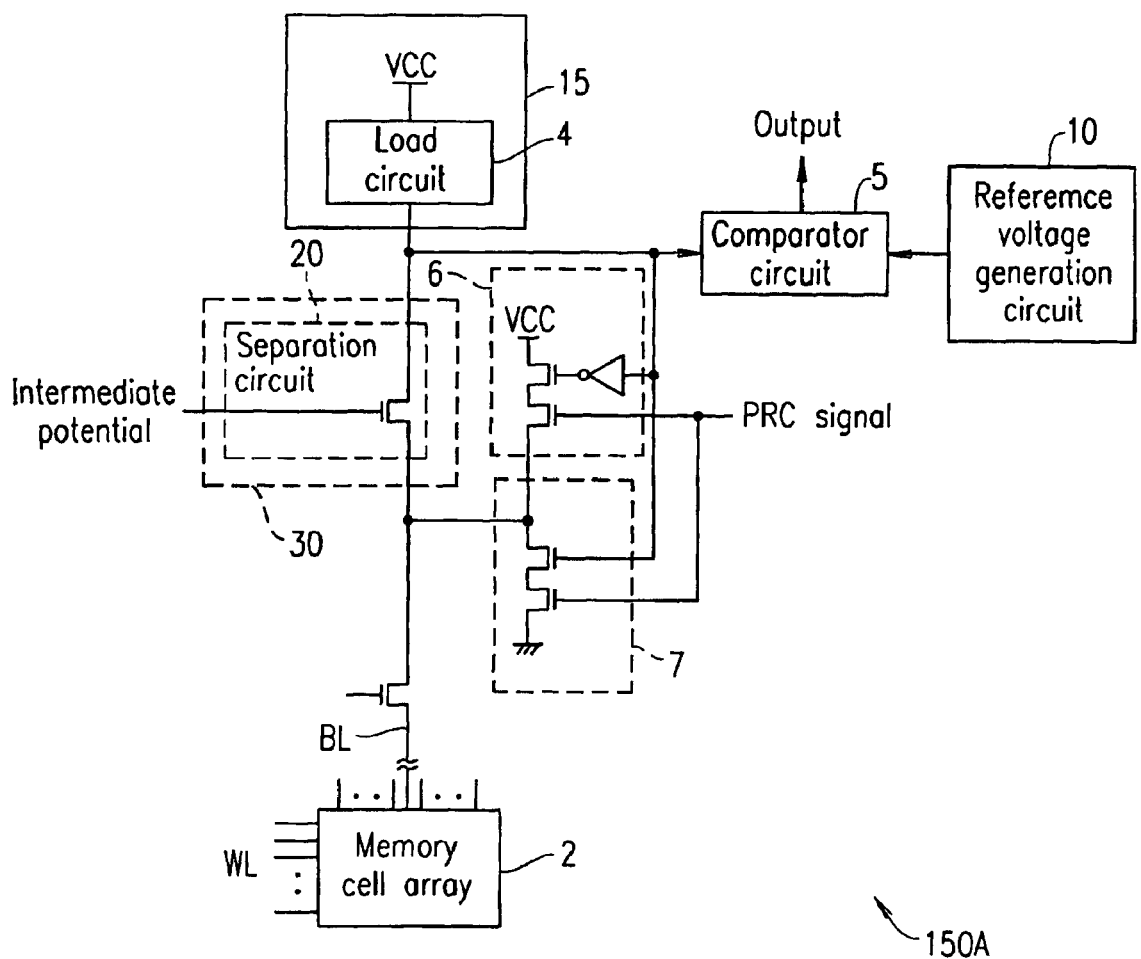
FIG. 23 is a block diagram illustrating a partial structure of a semiconductor memory device according to another example of the present invention.

FIG. 23 is a block diagram illustrating a partial structure of a semiconductor memory device 150A according to another example of the present invention.

The semiconductor memory device 150A has the same structure as that of the semiconductor memory device 150 except that a disconnection circuit 30 includes a separation circuit 20 including an n-channel transistor having a gate electrode supplied with an intermediate voltage signal, instead of the feedback bias circuit 3.

The separation circuit 20 electrically disconnects the comparator circuit 5 and the memory cell from each other based on the intermediate voltage signal.

In the semiconductor memory device 150A, the intermediate voltage signal can be commonly used for a plurality of reading circuits. Therefore, the power consumption by the shoot-through circuit flowing through the transistor can be reduced as compared with the semiconductor memory device 150 shown in FIG. 1.

The clamp potential of the bit line can be adjusted by the intermediate voltage signal.

The feedback bias circuit 3 included in the semiconductor memory device 150 shown in FIG. 1 has a dynamic amplification function, which is advantageous in realizing a high speed reading operation.

In the above-described examples, flash memories are used as memory cells. Any type of memory which reads information based on the level of current flowing through the bit line can be used, and substantially the same effect is provided.

For example, an MRAM is usable as the memory cell.

Figure 16:
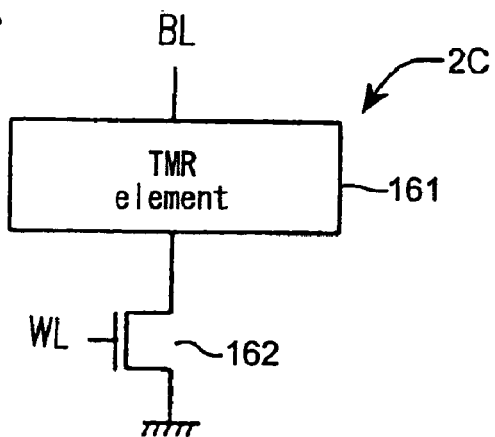
FIG. 16 shows a circuit configuration of an MRAM usable for the present invention.

FIG. 16 shows a circuit configuration of an exemplary MRAM 2c usable as the memory cell.

The MRAM 2c includes a TMR element 161 acting as a memory device for storing information and a transistor 162. A gate electrode of the transistor 162 is connected to a word line WL.

Figure 17:
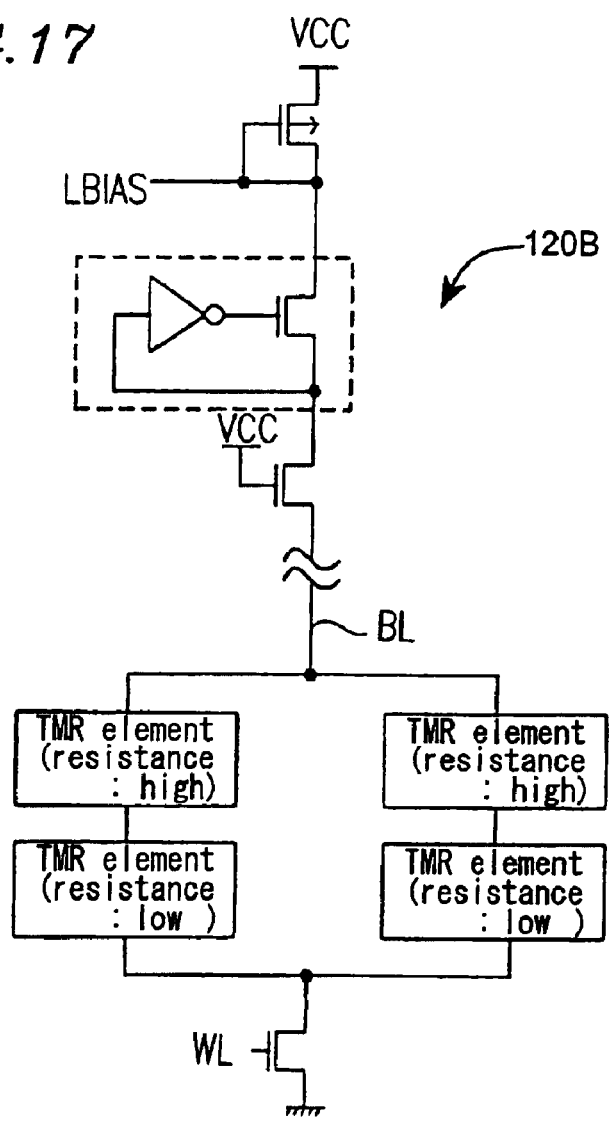
FIG. 17 shows a circuit configuration of an LBIAS voltage generation circuit which is suitable when the memory cell is an MRAM.

FIG. 17 shows a circuit configuration of an LBIAS voltage generation circuit 120B which is suitable for the case where the memory cells are MRAMs.

The LBIAS voltage generation circuit 120B has the same structure as that of the LBIAS voltage generation circuit 120 shown in FIG. 12 except that in the LBIAS voltage generation circuit 120B, a combination of two different TMR elements is used, instead of the flash cell transistor 2b having an adjustable threshold voltage.

Even when the memory cell is not a nonvolatile memory cell, for example, a read only memory (e.g., a mask ROM), the present invention is applicable. In this case, the flash cells are replaced with read only memory cells.

As described above, the reading circuit according to the present invention reads information stored in a memory cell at high speed and thus improves the performance of the semiconductor memory device. The high speed reading is still possible even when the capacitance and the resistance of the bit line are high. In the case where the bit line is made longer to reduce the number of memory blocks, the number of peripheral elements provided for each memory block is reduced. Thus, the chip size can be reduced.

Also according to the present invention, adjustments of various timings in the semiconductor memory device, for example, the charge time, can be simplified. Conventionally, the charge time is adjusted in consideration of the variance in the production processes in order to increase the access time.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A reading circuit for reading information stored in a memory cell, comprising:

a current supply circuit for supplying a current to a bit line connected to the memory cell;

a comparison circuit for comparing a potential of the bit line supplied with the current by the current supply circuit with a reference potential so as to output the information stored in the memory cell;

a disconnection circuit for electrically disconnecting the comparison circuit and the memory cell from each other under a prescribed condition;

a charge circuit for charging the bit line, the charge circuit stopping charging of the bit line when the potential of the bit line exceeds a prescribed potential; and a discharge circuit for discharging the bit line when the potential of the bit line exceeds the prescribed potential.

2. A reading circuit according to claim 1, wherein the disconnection circuit includes a feedback bias circuit for electrically disconnecting the comparison circuit and the memory cell from each other when the potential of the bit line exceeds the prescribed potential.

3. A reading circuit according to claim 2, wherein the feedback bias circuit controls the potential of the bit line in a feedback manner and restricts the potential of the bit line within a prescribed operating range of the comparison circuit.

4. A reading circuit according to claim 1, wherein the disconnecting circuit includes a separation circuit for electrically disconnecting the comparison circuit and the memory cell from each other based on a prescribed signal.

5. A reading circuit according to claim 1, wherein the charge circuit controls the potential of the bit line in a feedback manner and restricts the potential of the bit line within a prescribed operating range of the comparison circuit.

6. A reading circuit according to claim 1, further comprising a reference voltage generation circuit for generating a reference voltage representing the reference potential.

7. A reading circuit according to claim 6, wherein: the reference voltage generation circuit includes a reference charge circuit for charging a reference bit line connected to a reference cell, the reference charge circuit stopping the charging of the reference bit line when a potential of the reference bit line exceeds a prescribed potential, and the charge circuit is short circuited with the reference charge circuit while the charge circuit charges the bit line connected to the memory cell.

8. A reading circuit according to claim 1, wherein:

a current driving capability of the current supply circuit is controlled to compensate for a fluctuation in an electrical characteristic of the memory cell based on an input control signal generated using an active element having the same electric characteristic as that of the memory cell.

9. A semiconductor memory device, comprising:

a memory cell array including a plurality of memory cells, each of which is capable of storing information therein; and a reading circuit for reading information stored in one memory cell selected from the plurality of memory cells, wherein the reading circuit includes:

a current supply circuit for supplying a current to a bit line connected to the one memory cell;

a comparison circuit for comparing a potential of the bit line supplied with the current by the current supply circuit with a reference potential so as to output the information stored in the one memory cell;

a disconnection circuit for electrically disconnecting the comparison circuit and the one memory cell from each other under a prescribed condition;

a charge circuit for charging the bit line, the charge circuit stopping charging of the bit line when the potential of the bit line exceeds a prescribed potential; and a discharge circuit for discharging the bit line when the potential of the bit line exceeds the prescribed potential.

10. A semiconductor memory device according to claim 9, wherein:

the charge circuit starts charging the bit line based on a charging start signal, and the charging start signal is generated based on detection of a transition of an address terminal signal.

11. A semiconductor memory device according to claim 9, wherein each of the plurality of memory cells is a flash memory cell, a magnetoresistance element, or a read only memory cell.

* * * * *